US012791939B2

(12) United States Patent
Fisher et al.

(10) Patent No.: US 12,791,939 B2
(45) Date of Patent: Nov. 10, 2026

(54) METHODS FOR MAKING FLOW CELLS

(71) Applicant: ILLUMINA, INC., San Diego, CA (US)

(72) Inventors: Jeffrey S. Fisher, San Diego, CA (US); Sahngki Hong, San Diego, CA (US); Lewis J. Kraft, San Diego, CA (US); David Prescott, San Diego, CA (US); Brandon Wenning, San Diego, CA (US); Weixian Xi, San Diego, CA (US)

(73) Assignee: Illumina, Inc., San Diego, CA (US)

( * ) Notice: Subject to any disclaimer, the term of this patent is extended or adjusted under 35 U.S.C. 154(b) by 507 days.

(21) Appl. No.: 18/520,093

(22) Filed: Nov. 27, 2023

(65) Prior Publication Data

US 2024/0210829 A1 Jun. 27, 2024

Related U.S. Application Data

(60) Provisional application No. 63/385,166, filed on Nov. 28, 2022.

(51) Int. Cl.
*G03F 7/039* (2006.01)
*G03F 7/038* (2006.01)
(Continued)

(52) U.S. Cl.
CPC .............. *G03F 7/039* (2013.01); *G03F 7/038* (2013.01); *G03F 7/11* (2013.01); *G03F 7/2004* (2013.01)

(58) Field of Classification Search
CPC . G03F 7/039; G03F 7/038; G03F 7/11; G03F 7/2004
See application file for complete search history.

(56) References Cited

U.S. PATENT DOCUMENTS 7,403,236 B2 * 7/2008 Jung ..................... G02F 1/1393 355/67
7,948,564 B2 * 5/2011 Jung ..................... G02F 1/1393 349/4

(Continued)

FOREIGN PATENT DOCUMENTS

WO 2022072274 A1 4/2022
WO 2022072275 A1 4/2022

OTHER PUBLICATIONS

Sato et al., "Fabrication of Polymer and Metal Three-Dimensional Micromesh Structures", Japanese Journal of Applied Physics, vol. 43, No. 12, 2004, pp. 8341-8344, 2004.

(Continued)

*Primary Examiner* — Stewart A Fraser
(74) *Attorney, Agent, or Firm* — Dierker & Kavanaugh, P.C.

(57) ABSTRACT

In an example method, a positive photoresist is deposited over a substrate that includes depressions separated by interstitial regions. The positive photoresist is exposed to ultraviolet light at an angle that is non-perpendicular, non-parallel, and offset from a surface plane of the depressions such that a first portion of the positive photoresist in each depression remains soluble and a second portion of the positive photoresist in each depression is rendered insoluble. The soluble portions of the positive photoresist are removed, which exposes a first substrate portion in each depression. A first functionalized layer is deposited over the first substrate portion in each depression. The insoluble portions of the positive photoresist are removed, which exposes a second substrate portion in each depression. The second functionalized layer is selectively deposited over the second substrate portion in each depression.

19 Claims, 12 Drawing Sheets

Specification includes a Sequence Listing.

(51) Int. Cl.
*G03F 7/11* (2006.01)
*G03F 7/20* (2006.01)

(56) References Cited

U.S. PATENT DOCUMENTS

2006/0030030 A1* 2/2006 Jung ..................... G02F 1/1393 349/1
2008/0273128 A1* 11/2008 Jung ..................... G02F 1/1393 349/4
2022/0100091 A1* 3/2022 Hong ................... B01J 19/0046
2022/0379305 A1* 12/2022 Kodira Cariappa ......................... B01J 19/0046
2022/0382147 A1* 12/2022 Kodira Cariappa .. G03F 7/2016
2023/0137978 A1* 5/2023 Fisher ..................... G03F 7/038 430/323
2023/0139821 A1* 5/2023 Fisher ..................... G03F 7/039 430/323

OTHER PUBLICATIONS

Lee et al., "A simple and effective fabrication method for various 3D microstructures: backside 3D diffuser lithography", J. Micromech. Microeng. 18 (2008) 125015 (7pp) doi:10.1088/0960-1317/18/12/125015, 2008.

Zhu et al., "Modeling, simulation and experimental verification of inclined UV lithography for SU-8 negative thick photoresists", J. Micromech. Microeng. 18 (2008) 125017 (11 pp) doi: 10.1088/0960-1317/18/12/125017, 2008.

Fenech et al., "Microfluidic blood vasculature replicas using backside lithography", Lab Chip, 2019, 19, 2096-2106, DOI: 10.1039/c9lc00254e, 2019.

* cited by examiner

SEQUENCE LISTING

```
Sequence total quantity: 14
SEQ ID NO: 1            moltype = DNA  length = 28
FEATURE                 Location/Qualifiers
source                  1..28
                        mol_type = other DNA
                        organism = synthetic construct
SEQUENCE: 1
aatgatacgg cgaccaccga gactacac                                      28

SEQ ID NO: 2            moltype = DNA  length = 23
FEATURE                 Location/Qualifiers
source                  1..23
                        mol_type = other DNA
                        organism = synthetic construct
SEQUENCE: 2
caagcagaag acggcatacg aat                                           23

SEQ ID NO: 3            moltype = DNA  length = 23
FEATURE                 Location/Qualifiers
source                  1..23
                        mol_type = other DNA
                        organism = synthetic construct
SEQUENCE: 3
caagcagaag acggcataca gat                                           23

SEQ ID NO: 4            moltype = DNA  length = 35
FEATURE                 Location/Qualifiers
source                  1..35
                        mol_type = other DNA
                        organism = synthetic construct
SEQUENCE: 4
gctggcacgt ccgaacgctt cgttaatccg ttgag                              35

SEQ ID NO: 5            moltype = DNA  length = 35
FEATURE                 Location/Qualifiers
source                  1..35
                        mol_type = other DNA
                        organism = synthetic construct
SEQUENCE: 5
cgtcgtctgc catggcgctt cggtggatat gaact                              35

SEQ ID NO: 6            moltype = DNA  length = 35
FEATURE                 Location/Qualifiers
```

-continued

```
source                  1..35
                        mol_type = other DNA
                        organism = synthetic construct
SEQUENCE: 6
acggccgcta atatcaacgc gtcgaatccg caact                            35

SEQ ID NO: 7            moltype = DNA  length = 34
FEATURE                 Location/Qualifiers
source                  1..34
                        mol_type = other DNA
                        organism = synthetic construct
SEQUENCE: 7
gccgcgttac gttagccgga ctattcgatg cagc                             34

SEQ ID NO: 8            moltype = DNA  length = 29
FEATURE                 Location/Qualifiers
source                  1..29
                        mol_type = other DNA
                        organism = synthetic construct
modified_base           23
                        mod_base = OTHER
                        note = Uracil
SEQUENCE: 8
aatgatacgg cgaccaccga gatctacac                                   29

SEQ ID NO: 9            moltype = DNA  length = 29
FEATURE                 Location/Qualifiers
source                  1..29
                        mol_type = other DNA
                        organism = synthetic construct
modified_base           23
                        mod_base = OTHER
                        note = alkene-thymidine
SEQUENCE: 9
aatgatacgg cgaccaccga ganctacac                                   29

SEQ ID NO: 10           moltype = DNA  length = 24
FEATURE                 Location/Qualifiers
source                  1..24
                        mol_type = other DNA
                        organism = synthetic construct
modified_base           22
                        mod_base = OTHER
                        note = 8-oxoguanine
SEQUENCE: 10
caagcagaag acggcatacg anat                                        24

SEQ ID NO: 11           moltype = DNA  length = 24
FEATURE                 Location/Qualifiers
source                  1..24
                        mol_type = other DNA
                        organism = synthetic construct
modified_base           20
                        mod_base = OTHER
                        note = 8-oxoguanine
SEQUENCE: 11
caagcagaag acggcatacn agat                                        24

SEQ ID NO: 12           moltype = DNA  length = 24
FEATURE                 Location/Qualifiers
source                  1..24
                        mol_type = other DNA
                        organism = synthetic construct
modified_base           20
                        mod_base = OTHER
                        mod_base = OTHER
                        note = 8-oxoguanine
modified_base           22
                        mod_base = OTHER
                        note = 8-oxoguanine
SEQUENCE: 12
caagcagaag acggcatacn anat                                        24

SEQ ID NO: 13           moltype = DNA  length = 29
FEATURE                 Location/Qualifiers
source                  1..29
                        mol_type = other DNA
                        organism = synthetic construct
modified_base           23
```

-continued

```
                        mod_base = OTHER
                        note = allyl T
SEQUENCE: 13
aatgatacgg cgaccaccga ganctacac                                    29

SEQ ID NO: 14           moltype = DNA  length = 24
FEATURE                 Location/Qualifiers
source                  1..24
                        mol_type = other DNA
                        organism = synthetic construct
SEQUENCE: 14
aggaggagga ggaggaggag gagg                                         24
```

METHODS FOR MAKING FLOW CELLS

CROSS-REFERENCE TO RELATED APPLICATIONS

This application claims the benefit of U.S. Provisional Application Ser. No. 63/385,166, filed Nov. 28, 2022, the content of which is incorporated by reference herein in its entirety.

REFERENCE TO SEQUENCE LISTING

The Sequence Listing submitted herewith is hereby incorporated by reference in its entirety. The name of the file is ILI253B_IP-2433-US_Sequence_Listing.xml, the size of the file is 17,336 bytes, and the date of creation of the file is Nov. 15, 2023.

BACKGROUND

Some available platforms for sequencing nucleic acids utilize a sequencing-by-synthesis approach. With this approach, a nascent strand is synthesized, and the addition of each monomer (e.g., nucleotide) to the growing strand is detected optically and/or electronically. Because a template strand directs synthesis of the nascent strand, one can infer the sequence of the template DNA from the series of nucleotide monomers that were added to the growing strand during the synthesis. In some examples, sequential paired-end sequencing may be used, where forward strands are sequenced and removed, and then reverse strands are constructed and sequenced. In other examples, simultaneous paired-end sequencing may be used, where forward strands and reverse strands are sequenced at the same time.

SUMMARY

For simultaneous paired-end sequencing, different primer sets are attached to different regions within each depression of a flow cell surface. These primer sets are attached through functionalized layer(s). Several example methods are described herein to place the primers sets in the desired regions such that, during optical imaging, the signals from one region do not deleteriously affect the signals from another region. In particular, the methods reduce or eliminate the occurrence of one region and primer set surrounding another region and primer set in a padlock like conformation or configuration. It has been found that by reducing the padlock like conformation, signal resolution from each of the regions is improved.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIG. 4A depicts a substrate with a depression defined therein, FIG. 4B depicts a positive photoresist applied to the substrate and exposed to angled ultraviolet (UV) light, FIG. 4C depicts the insoluble positive photoresist in a portion of the depression, FIG. 4D depicts a first functionalized layer applied to a second portion of the depression, FIG. 4E depicts a second functionalized layer applied to the portion of the depression after the insoluble positive photoresist is removed, and FIG. 4F depicts the substrate with the functionalized layers in the depression and removed from the interstitial regions;

FIG. 5A depicts a substrate with a depression defined therein and a photoactive layer applied to the depression, FIG. 5B depicts the selective activation of a portion of the photoactive layer, FIG. 5C depicts a first functionalized layer applied to the activated portion of the photoactive layer, FIG. 5D depicts the selective activation of a second portion of the photoactive layer, and FIG. 5E depicts a second functionalized layer applied to the activated second portion of the photoactive layer;

FIG. 6A depicts a multi-layer stack with a depression defined therein, FIG. 6B depicts the multi-layer stack after etching to define a depression portion in a substrate, FIG. 6C depicts a negative photoresist applied to the substrate and exposed to angled ultraviolet (UV) light, FIG. 6D depicts the insoluble negative photoresist in a portion of the depression after soluble portions of the negative photoresist are removed, FIG. 6E depicts the insoluble negative photoresist in a portion of the depression after the multi-layer stack is exposed to additional etching to form a second depression portion, FIG. 6F depicts a first functionalized layer applied to the second depression portion, FIG. 6G depicts the exposure of the depression portion after the insoluble negative photoresist is removed, FIG. 6H depicts a second functionalized layer applied to the depression portion, and FIG. 6I depicts the substrate with the functionalized layers in the depression and removed from the interstitial regions;

FIG. 6A through FIG. 6D and FIG. 6J through FIG. 6N together schematically depict an example method where: FIG. 6A depicts a multi-layer stack with a depression defined therein, FIG. 6B depicts the multi-layer stack after etching to define a depression portion in a substrate, FIG. 6C depicts a negative photoresist applied to the substrate and exposed to angled ultraviolet (UV) light, FIG. 6D depicts the insoluble negative photoresist in a portion of the depression after soluble portions of the negative photoresist are removed, FIG. 6J depicts the insoluble negative photoresist in a portion of the depression after the multi-layer stack is exposed to additional etching to form a second depression portion, FIG. 6K depicts a first functionalized layer applied to the second depression portion, FIG. 6L depicts the exposure of the depression portion after the insoluble negative photoresist is removed, FIG. 6M depicts a second functionalized layer applied to the depression portion, and FIG. 6N depicts the substrate with the functionalized layers in the depression and removed from the interstitial regions;

FIG. 7E is optional) together schematically depict an example method where: FIG. 7A depicts a multi-layer stack with a depression defined therein, FIG. 7B depicts the multi-layer stack after etching to define a depression portion in a substrate, FIG. 7C depicts a negative photoresist applied to the substrate and exposed to diffused ultraviolet (UV) light to form an insoluble negative photoresist, FIG. 7D depicts the insoluble negative photoresist in a portion of the depression after soluble portions of the negative photoresist are removed, FIG. 7E depicts isotopic etching of a portion of the insoluble negative photoresist, FIG. 7F depicts the insoluble negative photoresist in a portion of the depression after the multi-layer stack is exposed to additional etching to form a second depression portion, FIG. 7G depicts a first functionalized layer applied to the second depression portion, FIG. 7H depicts the exposure of the depression portion after the insoluble negative photoresist is removed, FIG. 7I depicts a second functionalized layer applied to the depression portion, and FIG. 7J depicts the substrate with the functionalized layers in the depression and removed from the interstitial regions;

FIG. 7A through FIG. 7D, optionally FIG. 7E, and FIG. 7K through FIG. 7O together schematically depict an example method where: FIG. 7A depicts a multi-layer stack with a depression defined therein, FIG. 7B depicts the multi-layer stack after etching to define a depression portion in a substrate, FIG. 7C depicts a negative photoresist applied to the substrate and exposed to diffused ultraviolet (UV) light to form an insoluble negative photoresist, FIG. 7D depicts the insoluble negative photoresist in a portion of the depression after soluble portions of the negative photoresist are removed, FIG. 7E depicts isotopic etching of a portion of the insoluble negative photoresist.

DETAILED DESCRIPTION

Examples of the flow cells disclosed herein may be used for sequencing, examples of which include simultaneous paired-end nucleic acid sequencing.

For simultaneous paired-end sequencing, different primer sets are attached to different regions within each depression of the flow cell. In these examples, the primer sets may be controlled so that the cleaving (linearization) chemistry is orthogonal in the different regions. In these examples, orthogonal cleaving chemistry may be realized through identical cleavage sites that are attached to different primers in the different sets, or through different cleavage sites that are attached to different primers in the different sets. This enables a cluster of forward strands to be generated in one region and a cluster of reverse strands to be generated in another region. In an example, the regions are directly adjacent to one another. In another example, any space between the regions is small enough that clustering can span the two regions. In any of these examples, the forward and reverse strands are spatially separate, which separates the fluorescence signals from both reads while allowing for simultaneous base calling of each read.

Figure 1A:
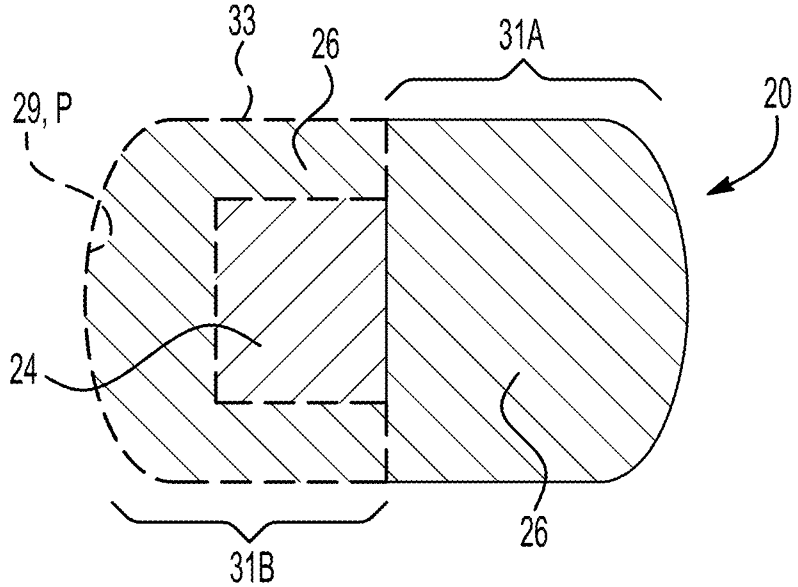
FIG. 1A schematically depicts a top view of an example depression with a padlock conformation.
Figure 1B:
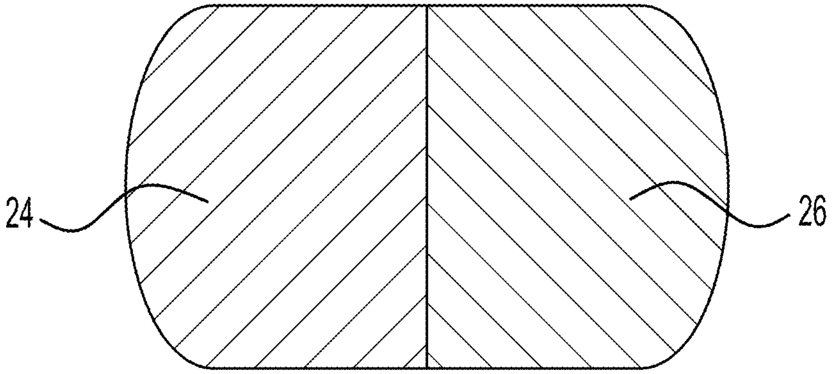
FIG. 1B schematically depicts a top view of an example depression without a padlock like conformation.

It has been found that some methods used to produce the spatially separate regions where the primer sets (and ultimately the forward and reverse strands) are respectively attached generate a padlock like conformation where, from a top view, one region is surrounded by the other region within the depression. An example of this padlock like conformation is shown in FIG. 1A, which depicts the top view of one depression 20. As shown in FIG. 1A, the depression 20 of the flow cell includes adjacent functionalized layers 24, 26, which define the regions where the different primer sets (not shown) are respectively attached. In this example, the functionalized layer 26 is formed in part 31A of the depression 20, and it is desirable for the other functionalized layer 24 to be formed in the adjacent part 31B of the depression 20. However, as a result of the method used, the functionalized layer 26 is applied along sidewall(s) 29 at the perimeter P of the depression 20 in the adjacent part 31B. As illustrated, the functionalized layer 26 may align the perimeter 29, P, and surround the functionalized layer 24, generating the padlock like conformation 33. Forward or reverse strands will form during amplification on the functionalized layer 26 in the padlock like conformation 33; and during sequencing, the signals from these strands may contaminate the signals from the strands formed on the functionalized layer 24. The methods disclosed herein eliminate the padlock like conformation 33 (e.g., as shown in FIG. 1B) because the functionalized layer 26 is no longer present in the part 31B of the depression 20.

Definitions

It is to be understood that terms used herein will take on their ordinary meaning in the relevant art unless specified otherwise. Several terms used herein and their meanings are set forth below.

The singular forms "a", "an", and "the" include plural referents unless the context clearly dictates otherwise.

The terms comprising, including, containing and various forms of these terms are synonymous with each other and are meant to be equally broad.

The terms top, bottom, lower, upper, on, etc. are used herein to describe the flow cell and/or the various components of the flow cell. It is to be understood that these directional terms are not meant to imply a specific orientation, but are used to designate relative orientation between components. The use of directional terms should not be interpreted to limit the examples disclosed herein to any specific orientation(s).

The terms first, second, etc. also are not meant to imply a specific orientation or order, but rather are used to distinguish one component from another.

It is to be understood that the ranges provided herein include the stated range and any value or sub-range within the stated range, as if such values or sub-ranges were explicitly recited. For example, a range of about 400 nm to about 1 μm (1000 nm), should be interpreted to include not only the explicitly recited limits of about 400 nm to about 1 μm, but also to include individual values, such as about 708 nm, about 945.5 nm, etc., and sub-ranges, such as from about 425 nm to about 825 nm, from about 550 nm to about 940 nm, etc. Furthermore, when "about" and/or "substantially" are/is utilized to describe a value, they are meant to encompass minor variations (up to +/−10%) from the stated value.

An "acrylamide monomer" is a monomer with the structure

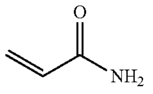

or a monomer including an acrylamide group. Examples of the monomer including an acrylamide group include azido acetamido pentyl acrylamide:

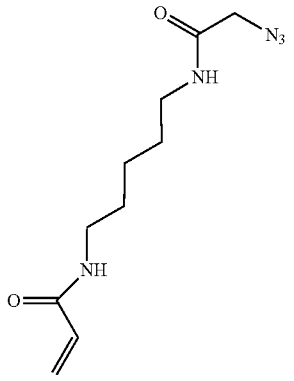 [SMILES: C=CC(=O)NCCCCCNC(=O)CN=[N+]=[N-]]

and N-isopropylacrylamide:

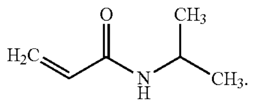

Other acrylamide monomers may be used.

The term "activation," as used herein, refers to a process that generates reactive groups at the surface of a base support or an outermost layer of a multi-layered structure. Activation may be accomplished using silanization or plasma ashing. While the figures do not depict a separate silanized layer or hydroxyl (—OH groups) from plasma ashing, it is to be understood that activation generates a silanized layer or —OH groups at the surface of the activated support or layer to covalently attach the functionalized layers to the underlying support or layer.

An "aldehyde," as used herein, is an organic compound containing a functional group with the structure -CHO, which includes a carbonyl center (i.e., a carbon double-bonded to oxygen) with the carbon atom also bonded to hydrogen and an R group, such as an alkyl or other side chain. The general structure of an aldehyde is:

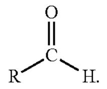

As used herein, "alkyl" refers to a straight or branched hydrocarbon chain that is fully saturated (i.e., contains no double or triple bonds). The alkyl group may have 1 to 20 carbon atoms. Example alkyl groups include methyl, ethyl, propyl, isopropyl, butyl, isobutyl, tertiary butyl, pentyl, hexyl, and the like. As an example, the designation "C1-4 alkyl" indicates that there are one to four carbon atoms in the alkyl chain, i.e., the alkyl chain is selected from the group consisting of methyl, ethyl, propyl, iso-propyl, n-butyl, isobutyl, sec-butyl, and t-butyl.

As used herein, "alkenyl" refers to a straight or branched hydrocarbon chain containing one or more double bonds. The alkenyl group may have 2 to 20 carbon atoms. Example alkenyl groups include ethenyl, propenyl, butenyl, pentenyl, hexenyl, and the like.

As used herein, "alkyne" or "alkynyl" refers to a straight or branched hydrocarbon chain containing one or more triple bonds. The alkynyl group may have 2 to 20 carbon atoms.

As used herein, "aryl" refers to an aromatic ring or ring system (i.e., two or more fused rings that share two adjacent carbon atoms) containing only carbon in the ring backbone. When the aryl is a ring system, every ring in the system is aromatic. The aryl group may have 6 to 18 carbon atoms. Examples of aryl groups include phenyl, naphthyl, azulenyl, and anthracenyl.

An "amine" or "amino" functional group refers to an $—NR_aR_b$ group, where $R_a$ and $R_b$ are each independently selected from hydrogen (e.g., 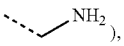), C1-6 (or C1-C6) alkyl, C2-6 alkenyl, C2-6 alkynyl, C3-7 carbocycle, C6-10 aryl, 5-10 membered heteroaryl, and 5-10 membered heterocycle, as defined herein.

As used herein, the term "attached" refers to the state of two things being joined, fastened, adhered, connected or bound to each other, either directly or indirectly. For example, a nucleic acid can be attached to a functionalized polymer by a covalent or non-covalent bond. A covalent bond is characterized by the sharing of pairs of electrons between atoms. A non-covalent bond is a physical bond that does not involve the sharing of pairs of electrons and can include, for example, hydrogen bonds, ionic bonds, van der Waals forces, hydrophilic interactions and hydrophobic interactions.

An "azide" or "azido" functional group refers to $—N_3$.

As used herein, a "bonding region" refers to an area of a patterned structure that is to be bonded to another material, which may be, as examples, a spacer layer, a lid, another patterned structure, etc., or combinations thereof (e.g., a spacer layer and a lid, or a spacer layer and another patterned structure). The bond that is formed at the bonding region may be a chemical bond, or a mechanical bond (e.g., using a fastener, etc.).

As used herein, "carbocycle" means a non-aromatic cyclic ring or ring system containing only carbon atoms in the ring system backbone. When the carbocycle is a ring system, two or more rings may be joined together in a fused, bridged or spiro-connected fashion. Carbocycles may have any degree of saturation, provided that at least one ring in a ring system is not aromatic. Thus, carbocycles include cycloalkyls, cycloalkenyls, and cycloalkynyls. The carbocycle group may have 3 to 20 carbon atoms. Examples of carbocycle rings include cyclopropyl, cyclobutyl, cyclopentyl, cyclohexyl, cyclohexenyl, 2,3-dihydro-indene, bicyclo[2.2.2]octanyl, adamantyl, and spiro[4.4]nonanyl.

As used herein, the term "carboxylic acid" or "carboxyl" as used herein refers to —COOH.

As used herein, "cycloalkylene" means a fully saturated carbocycle ring or ring system that is attached to the rest of the molecule via two points of attachment.

As used herein, "cycloalkenyl" or "cycloalkene" means a carbocycle ring or ring system having at least one double bond, wherein no ring in the ring system is aromatic. Examples include cyclohexenyl or cyclohexene and norbornenyl or norbornene. Also as used herein, "heterocycloalkenyl" or "heterocycloalkene" means a carbocycle ring or ring system with at least one heteroatom in ring backbone, having at least one double bond, wherein no ring in the ring system is aromatic.

As used herein, "cycloalkynyl" or "cycloalkyne" means a carbocycle ring or ring system having at least one triple bond, wherein no ring in the ring system is aromatic. An example is cyclooctyne. Another example is bicyclononyne. Also as used herein, "heterocycloalkynyl" or "heterocycloalkyne" means a carbocycle ring or ring system with at least one heteroatom in ring backbone, having at least one triple bond, wherein no ring in the ring system is aromatic.

As used herein, the terms "deep portion" and "shallow portion" refer to three-dimensional (3D) spaces within a multi-depth concave region. In the multi-depth concave region, the deep portion has a greater depth than the shallow portion, as measured, e.g., from an opening of the multi-depth concave region. In some examples of the method disclosed herein, the material that defines the multi-depth concave region is processed, and the configurations of the deep and/or shallow portions may change as a result of this processing. As an example, a resin layer that defines a multi-depth concave region may be processed to create a single depth depression in an underlying base support or in an outermost layer of a multi-layered structure.

The term "depositing," as used herein, refers to any suitable application technique, which may be manual or automated, and, in some instances, results in modification of the surface properties. Generally, depositing may be performed using vapor deposition techniques, coating techniques, grafting techniques, or the like. Some specific examples include chemical vapor deposition (CVD), spray coating (e.g., ultrasonic spray coating), spin coating, dunk or dip coating, doctor blade coating, puddle dispensing, flow through coating, aerosol printing, screen printing, microcontact printing, inkjet printing, or the like.

As used herein, the term "depression" refers to a discrete concave feature, defined in a base support or an outermost layer of a multi-layered structure, and having a surface opening that is at least partially surrounded by interstitial region(s) of the base support or outermost layer. Depressions can have any of a variety of shapes at their opening in a surface including, as examples, round, elliptical, square, polygonal, star shaped (with any number of vertices), etc. The cross-section of a depression taken orthogonally with the surface can be curved, square, polygonal, hyperbolic, conical, angular, etc.

The term "each," when used in reference to a collection of items, is intended to identify an individual item in the collection, but does not necessarily refer to every item in the collection. Exceptions can occur if explicit disclosure or context clearly dictates otherwise.

The term "epoxy" (also referred to as a glycidyl or oxirane group) as used herein refers to

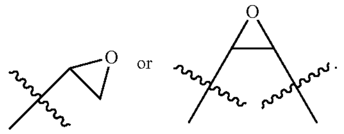

As used herein, the term "flow cell" is intended to mean a vessel having a flow channel where a reaction can be carried out, an inlet for delivering reagent(s) to the flow channel, and an outlet for removing reagent(s) from the flow channel. In some examples, the flow cell accommodates the detection of the reaction that occurs in the flow cell. For example, the flow cell can include one or more transparent surfaces allowing for the optical detection of arrays, optically labeled molecules, or the like.

As used herein, a "flow channel" or "channel" may be an enclosed area defined between two bonded components or an area defined in patterned structure that is open to an external environment, which can selectively receive a liquid sample. In some examples, the flow channel may be defined between two patterned structures, and thus may be in fluid communication with surface chemistry of each of the patterned structures. In other examples, the flow channel may be defined between a patterned structure and a lid, and thus may be in fluid communication with surface chemistry of the one patterned structure. In still other examples, the flow channel may be defined in a patterned structure such that the surface chemistry within the flow channel is open to the external environment.

As used herein, a "functionalized layer" refers to a gel material that is applied over at least a portion of a flow cell patterned structure. The gel material includes functional group(s) that can attach to primer(s). The functionalized layer may be positioned within a portion of a depression defined in the substrate. The term "functionalized layer" also refers to the gel material that is applied over all or a portion of the substrate, and that is exposed to further processing to define the functionalized layer in the portion of the depression.

As used herein, "heteroaryl" refers to an aromatic ring or ring system (i.e., two or more fused rings that share two adjacent atoms) that contain(s) one or more heteroatoms, that is, an element other than carbon, including but not limited to, nitrogen, oxygen and sulfur, in the ring backbone. When the heteroaryl is a ring system, every ring in the system is aromatic. The heteroaryl group may have 5-18 ring members.

As used herein, "heterocycle" means a non-aromatic cyclic ring or ring system containing at least one heteroatom in the ring backbone. Heterocycles may be joined together in a fused, bridged or spiro-connected fashion. Heterocycles may have any degree of saturation provided that at least one ring in the ring system is not aromatic. In the ring system, the heteroatom(s) may be present in either a non-aromatic or aromatic ring. The heterocycle group may have 3 to 20 ring members (i.e., the number of atoms making up the ring backbone, including carbon atoms and heteroatoms). In some examples, the heteroatom(s) are O, N, or S.

The term "hydrazine" or "hydrazinyl" as used herein refers to a $—NHNH_2$ group.

As used herein, the term "hydrazone" or "hydrazonyl" as used herein

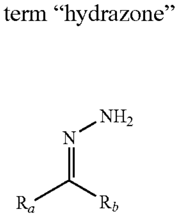

refers to a group in which $R_a$ and $R_b$ are each independently selected from hydrogen, C1-6 alkyl, C2-6 alkenyl, C2-6 alkynyl, C3-7 carbocycle, C6-10 aryl, 5-10 membered heteroaryl, and 5-10 membered heterocycle, as defined herein.

As used herein, "hydroxy" or "hydroxyl" refers to an —OH group.

As used herein, the term "interstitial region" refers to an area, e.g., of a base support or an outermost layer of a multi-layer structure, that separates depressions. For example, an interstitial region can separate one depression of an array from another depression of the array. The two depressions that are separated from each other can be discrete, i.e., lacking physical contact with each other. In many examples, the interstitial region is continuous, whereas the depressions are discrete, for example, as is the case for a plurality of depressions defined in an otherwise continuous surface. Interstitial regions may have a surface material that differs from the surface material of the depressions. For example, depressions can have a polymer and primer set(s) therein, and the interstitial regions can be free of polymer and primer set(s).

As used herein, a "negative photoresist" refers to a light sensitive material in which a portion that is exposed to light of particular wavelength(s) becomes insoluble to a developer. In these examples, the insoluble negative photoresist has less than 5% solubility in the developer. With the negative photoresist, the light exposure changes the chemical structure so that the exposed portions of the material becomes less soluble (than non-exposed portions) in the developer. While not soluble in the developer, the insoluble negative photoresist may be at least 99% soluble in a remover that is different from the developer. The remover may be a solvent or solvent mixture used, e.g., in a lift-off process.

In contrast to the insoluble negative photoresist, any portion of the negative photoresist that is not exposed to light is at least 95% soluble in the developer. This portion may be referred to as a "soluble negative photoresist". In some examples, the soluble negative photoresist is at least 98%, e.g., 99%, 99.5%, 100%, soluble in the developer.

"Nitrile oxide," as used herein, means a "$R_aC{\equiv}N^+O^-$" group in which Ra is defined herein. Examples of preparing nitrile oxide include in situ generation from aldoximes by treatment with chloramide-T or through action of base on imidoyl chlorides [RC(Cl)═NOH] or from the reaction between hydroxylamine and an aldehyde.

"Nitrone," as used herein, means a

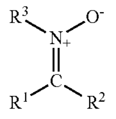

group in which $R^1$, $R^2$, and $R^3$ may be any of the $R_a$ and $R_b$ groups defined herein, except that $R^3$ is not hydrogen (H).

As used herein, a "nucleotide" includes a nitrogen containing heterocyclic base, a sugar, and one or more phosphate groups. Nucleotides are monomeric units of a nucleic acid sequence. In RNA, the sugar is a ribose, and in DNA, the sugar is a deoxyribose, i.e., a sugar lacking a hydroxyl group that is present at the 2' position in ribose. The nitrogen containing heterocyclic base (i.e., nucleobase) can be a purine base or a pyrimidine base. Purine bases include adenine (A) and guanine (G), and modified derivatives or analogs thereof. Pyrimidine bases include cytosine (C), thymine (T), and uracil (U), and modified derivatives or analogs thereof. The C-1 atom of deoxyribose is bonded to N-1 of a pyrimidine or N-9 of a purine. A nucleic acid analog may have any of the phosphate backbone, the sugar, or the nucleobase altered. Examples of nucleic acid analogs include, for example, universal bases or phosphate-sugar backbone analogs, such as peptide nucleic acid (PNA).

Figures 4A, 4B, 4C, 4D, 4E, 4F:
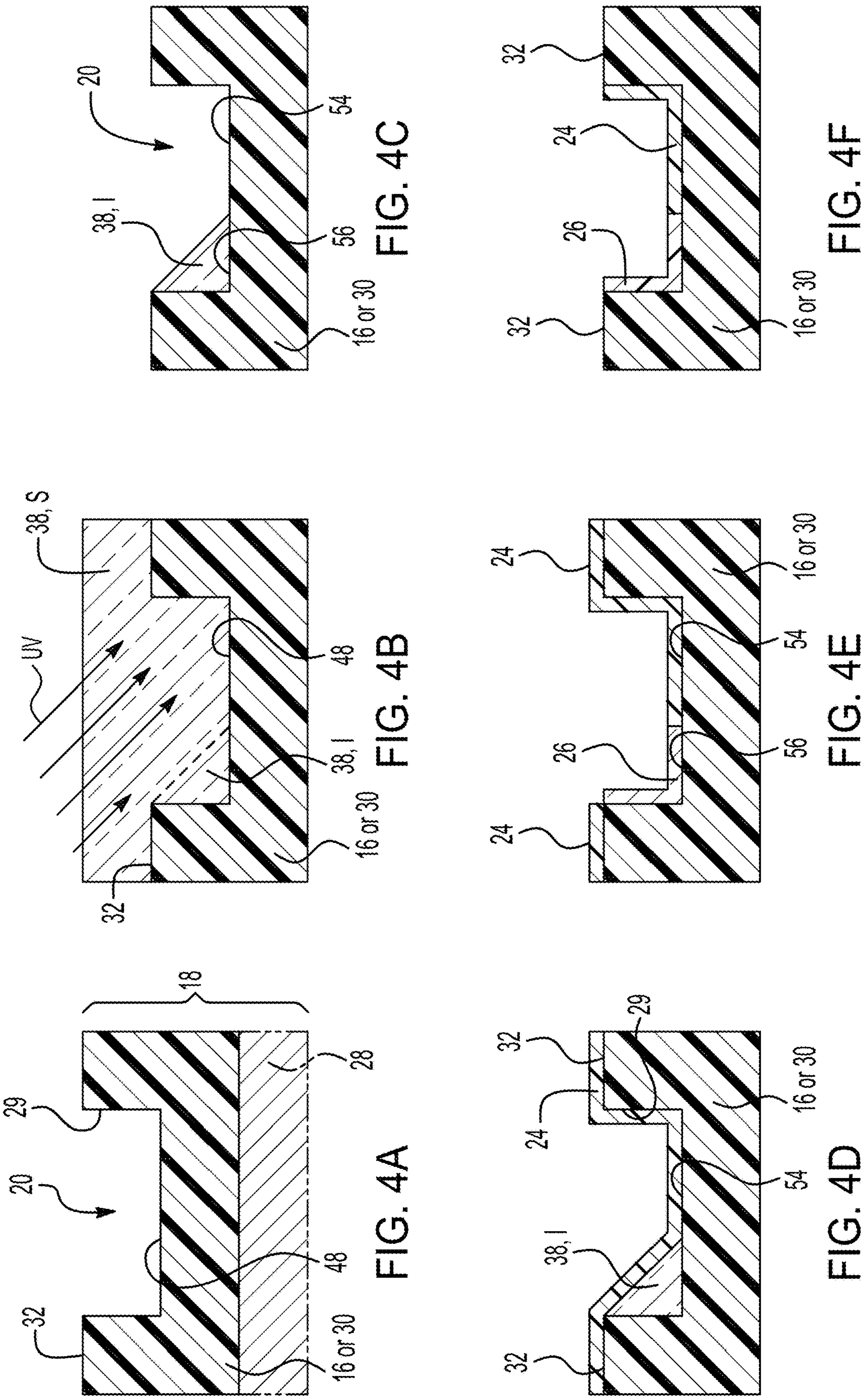
FIG. 4A through FIG. 4F together schematically depict an example method where.

In some examples, the term "over" may mean that one component or material is positioned directly on another component or material. When one is directly on another, the two are in contact with each other. In FIG. 4B, a positive photoresist is applied over a substrate or substrate layer so that it is directly on and in contact with the substrate or substrate layer.

Figure 7A:
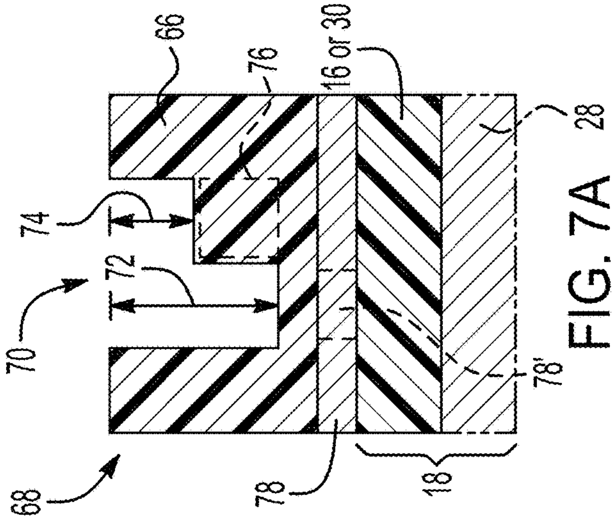
FIG. 7A through FIG. 7J (where
Figure 7B:
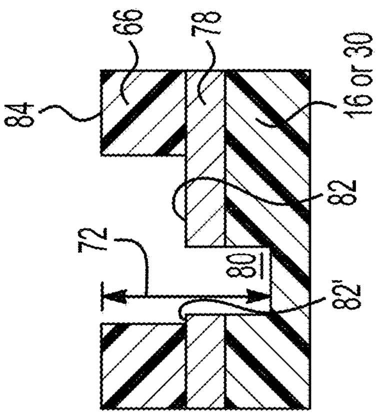

In other examples, the term "over" may mean that one component or material is positioned indirectly on another component or material. By indirectly on, it is meant that a gap or an additional component or material may be positioned between the two components or materials. In FIG. 7A, a patterned resin layer is positioned over the substrate such that the two are in indirect contact. The sacrificial layer is positioned therebetween.

A "patterned structure" refers to a substrate that includes surface chemistry in a pattern, e.g., in depressions across the substrate. The surface chemistry may include a functionalized layer and primers (e.g., used for library template capture and amplification). In some examples, the substrate has been exposed to patterning techniques (e.g., etching, lithography, etc.) in order to generate the pattern for the surface chemistry. However, the term "patterned structure" is not intended to imply that such patterning techniques have to be used to generate the pattern. The patterned structure may be generated via any of the methods disclosed herein.

As used herein, the term "polyhedral oligomeric silsesquioxane" refers to a chemical composition that is a hybrid intermediate (e.g., $RSiO_{1.5}$) between that of silica ($SiO_2$) and silicone ($R_2SiO$). An example of polyhedral oligomeric silsesquioxane may be that described in Kehagias et al., Microelectronic Engineering 86 (2009), pp. 776-778, which is incorporated by reference in its entirety. In an example, the composition is an organosilicon compound with the chemical formula $[RSiO_{3/2}]_n$, where the R groups can be the same or different. Example R groups for polyhedral oligomeric silsesquioxane include epoxy, azide/azido, a thiol, a poly(ethylene glycol), a norbornene, a tetrazine, acrylates, and/or methacrylates, or further, for example, alkyl, aryl, alkoxy, and/or haloalkyl groups.

As used herein, a "positive photoresist" refers to a light sensitive material in which a portion that is exposed to light of particular wavelength(s) becomes soluble to a developer. In these examples, any portion of the positive photoresist exposed to light is at least 95% soluble in the developer. This portion may be referred to herein as a "soluble positive photoresist." In some examples, the portion of the positive photoresist exposed to light (i.e., the soluble photoresist), is at least 98%, e.g., 99%, 99.5%, 100%, soluble in the developer. With the positive photoresist, the light exposure changes the chemical structure so that the exposed portions of the material become more soluble (than non-exposed portions) in the developer.

In contrast to the soluble positive photoresist, any portion of the positive photoresist not exposed to light is insoluble (less than 5% soluble) in the developer. This portion may be referred to as an "insoluble positive photoresist". While not soluble in the developer, the insoluble positive photoresist may be at least 99% soluble in a remover that is different from the developer. In some examples, the insoluble positive photoresist is at least 98%, e.g., 99%, 99.5%, 100%, soluble in the remover. The remover may be a solvent or solvent mixture used in a lift-off process.

As used herein, the "primer" is defined as a single stranded nucleic acid sequence (e.g., single strand DNA). Some primers, referred to herein as amplification primers, serve as a starting point for template amplification and cluster generation. Other primers, referred to herein as sequencing primers, serve as a starting point for DNA synthesis. The 5' terminus of the primer may be modified to allow a coupling reaction with a functional group of a polymer. The primer length can be any number of bases long and can include a variety of non-natural nucleotides. In an example, the sequencing primer is a short strand, ranging from 10 to 60 bases, or from 20 to 40 bases.

A "spacer layer," as used herein refers to a material that bonds two components together. In some examples, the spacer layer can be a radiation absorbing material that aids in bonding, or can be put into contact with a radiation absorbing material that aids in bonding.

The term "substrate" refers to the single layer base support or a multi-layer structure upon which surface chemistry is introduced.

A "thiol" functional group refers to -SH.

As used herein, the terms "tetrazine" and "tetrazinyl" refer to six-membered heteroaryl group comprising four nitrogen atoms. Tetrazine can be optionally substituted.

"Tetrazole," as used herein, refer to five-membered heterocyclic group including four nitrogen atoms. Tetrazole can be optionally substituted.

The term "transparent" refers to a material, e.g., in the form of a base support or layer, that is capable of transmitting a particular wavelength or range of wavelengths. For example, the material may be transparent to wavelength(s) that are used to chemically change a positive or negative photoresist. Transparency may be quantified using transmittance, i.e., the ratio of light energy falling on a body to that transmitted through the body. The transmittance of a transparent base support or a transparent layer will depend upon the thickness of the base support or layer, the wavelength of light, and the dosage of the light to which it is exposed. In the examples disclosed herein, the transmittance of the transparent base support or the transparent layer may range from 0.25 (25%) to 1 (100%). The material of the base support or layer may be a pure material, a material with some impurities, or a mixture of materials, as long as the resulting base support or layer is capable of the desired transmittance. Additionally, depending upon the transmittance of the base support or layer, the time for light exposure and/or the output power of the light source may be increased or decreased to deliver a suitable dose of light energy through the transparent base support and/or layer to achieve the desired effect (e.g., generating a soluble or insoluble photoresist).

Flow Cells

Examples of the flow cell disclosed herein generally include a substrate including depressions separated by interstitial regions; functionalized layers positioned at predetermined locations within each of the depressions; and respective primer sets attached to the functionalized layers.

Figure 2A:
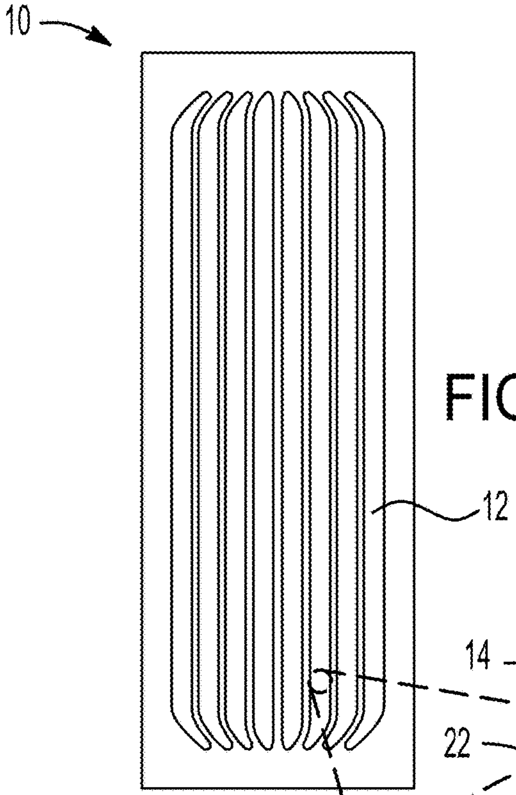
FIG. 2A depicts a top view of an example flow cell.
Figure 2B:
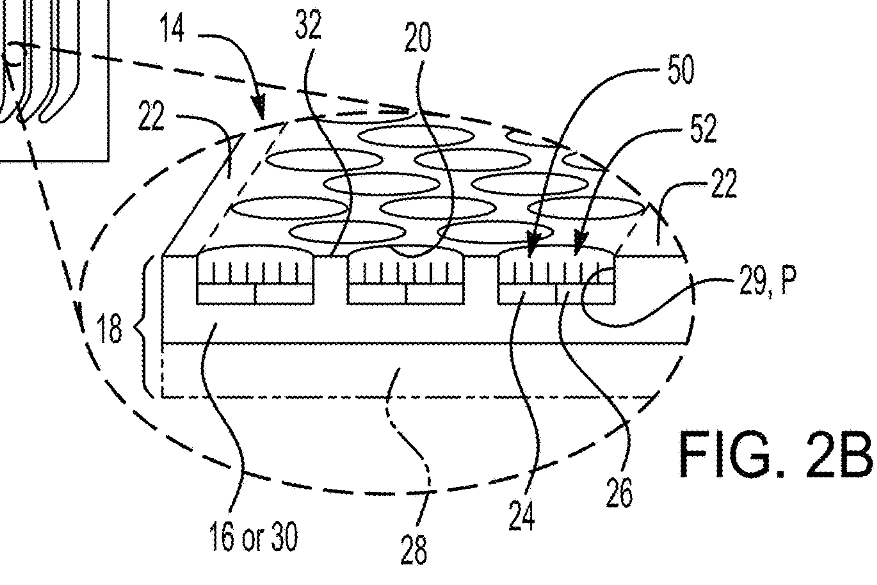
FIG. 2B is a schematic, enlarged, perspective, and partially cutaway view of an example of a flow channel of the flow cell.

A top view of a flow cell 10 is shown in FIG. 2A, and an example of the architecture within a flow channel 12 of the flow cell 10 is shown in FIG. 2B. The architecture may include one patterned structure 14 bonded to a lid (not shown) or two patterned structures (the second of which is not shown) bonded together or a single patterned structure 14 that is open to the external environment.

The enclosed version of the flow channel 12 is defined between the one patterned structure 14 and the lid or the second patterned structure which are bonded together via a spacer layer. Thus, each enclosed version of the flow channel 12 is defined by the patterned structure 14, the spacer layer, and either the lid or the second patterned structure.

The example flow cell 10 shown in FIG. 2A includes eight flow channels 12. While eight flow channels 12 are shown, it is to be understood that any number of flow channels 12 may be included in the flow cell 10 (e.g., a single flow channel 12, four flow channels 12, etc.). When multiple flow channels 12 are included, each flow channel 12 may be isolated from another flow channel 12 so that fluid introduced into a flow channel 12 does not flow into adjacent flow channel(s) 12.

Each flow channel 12 is in fluid communication with an inlet and an outlet (not shown). The inlet and outlet of each flow channel 12 may be positioned at opposed ends of the flow cell 10. The inlets and outlets of the respective flow channels 12 may alternatively be positioned anywhere along the length and width of the flow channel 12 that enables desirable fluid flow. The open flow channel 12 may have designated inlets and outlets, or may have fluids introduced and removed anywhere along the length of the flow channel 12.

The inlet allows fluids to be introduced into the flow channel 12, and the outlet allows fluid to be extracted from the flow channel 12. Each of the inlets and outlets is fluidly connected to a fluidic control system (including, e.g., reservoirs, pumps, valves, waste containers, and the like) which controls fluid introduction and expulsion. Some examples of the fluids introduced into the flow channel 12 may introduce reaction components (e.g., DNA sample, polymerases, sequencing primers, nucleotides, etc.), washing solutions, deblocking agents, etc.

The flow channel 12 may have any desirable shape. In an example, the flow channel 12 has a substantially rectangular configuration with curved ends (as shown in FIG. 2A). The length of the flow channel 12 depends, in part, upon the size of the substrate (e.g., 16 or 18, see FIG. 2B) used to form the patterned structure 14. The width of the flow channel 12 depends, in part, upon the size of the substrate 16, 18 used to form the patterned structure, the desired number of flow channels 12, the desired space between adjacent channels 12, and the desired space at a perimeter of the patterned structure 14. The spaces between channels 12 and at the perimeter may be sufficient for attachment to a lid (not shown) or another patterned structure (also not shown).

The depth of the flow channel 12 can be as small as a monolayer thick when microcontact, aerosol, or inkjet printing is used to deposit a separate material (e.g., the spacer layer (not shown)) that defines at least a portion of the sidewalls of the flow channel 12. For other examples, the depth of the flow channel 12 can be about 1 μm, about 10 μm, about 50 μm, about 100 μm, or more. In an example, the depth may range from about 10 μm to about 100 μm. In another example, the depth may range from about 10 μm to about 30 μm. In still another example, the depth is about 5 μm or less. It is to be understood that the depth of the flow channel 12 may be greater than, less than or between the values specified above.

The spacer layer used to attach the patterned structure 14 and the lid or the second patterned structure may be any material that will seal portions of the patterned structure 14 and the lid or the second patterned structure. As examples, the spacer layer may be an adhesive, a radiation-absorbing material that aids in bonding, or the like. In some examples, the spacer layer is the radiation-absorbing material, e.g., KAPTON® black.

The patterned structure 14 and the lid or the second patterned structure may be bonded using any suitable technique, such as laser bonding, diffusion bonding, anodic bonding, eutectic bonding, plasma activation bonding, glass frit bonding, or others methods known in the art.

When used, the lid may be any material that is transparent to the excitation light that is directed toward the flow cell 10. In optical detection systems, the lid may also be transparent to the emissions generated from reaction(s) taking place in the flow cell 10. As examples, the lid may include glass (e.g., borosilicate, fused silica, etc.) or a transparent polymer. A commercially available example of a suitable borosilicate glass is D 263®, available from Schott North America Inc. Commercially available examples of suitable polymer materials, namely cyclo olefin polymers, are the ZEONOR® products available from Zeon Chemicals L.P. In some instances, the lid is shaped to form the top of the flow cell 10, and in other instances, the lid is shaped to form both the top of the flow cell as well as sidewalls of the flow channel 12.

The patterned structure 14 includes a bonding region 22 where it can be sealed to the lid or to the second patterned structure. The bonding region 22 may be located at the perimeter of each flow channel 12 (as shown in FIG. 2B) and at the perimeter of the flow cell 10.

The patterned structure 14 includes a substrate 16 or 18, as shown in FIG. 2B. The substrate 16 is a single layer base support, and the substrate 18 is a multi-layered structure. The substrate 16 is a single material that has the depressions 20 defined therein. The substrate 18 includes a base support 28 and another layer 30 positioned on the base support 28, where the other layer 30 has the depressions 20 defined therein.

In examples of the method disclosed herein that do not utilize backside light exposure (see, e.g., the methods shown in FIG. 4A through FIG. 4F and FIG. 5A through FIG. 5E), the substrate 16 may be any suitable material. Examples of suitable materials include epoxy siloxane, glass, modified or functionalized glass, polymers (including acrylics, polystyrene and copolymers of styrene and other materials, polypropylene, polyethylene, polybutylene, polyurethanes, polytetrafluoroethylene (such as TEFLON® from Chemours), cyclic olefins/cyclo-olefin polymers (COP) (such as ZEONOR® from Zeon), polyimides, nylon (polyamides), etc.), ceramics/ceramic oxides, silica (i.e., silicon dioxide ($SiO_2$)), fused silica, or silica-based materials, aluminum silicate, silicon and modified silicon (e.g., boron doped p+ silicon), silicon nitride ($Si_3N_4$), tantalum pentoxide ($Ta_2O_5$) or other tantalum oxide(s) ($TaO_x$), hafnium oxide ($HfO_2$), carbon, metals, or the like. In some examples, the resins set forth hereinbelow may also be used as the single layer substrate 16.

In examples of the method disclosed herein that utilize backside light exposure (see, e.g., the methods shown in the FIG. 6 series and the FIG. 7 series), the substrate 16 may be any material that is capable of transmitting the light that is used to pattern an overlying photoresist (e.g., ultraviolet light) and that is used in nucleic acid sequencing (e.g., ultraviolet light and visible light). In these particular examples, suitable transparent materials include siloxanes, glass, modified or functionalized glass, polymers (including acrylics, polystyrene and copolymers of styrene and other materials, polyethylene terephthalate (PET), polycarbonate, cyclic olefin copolymer (COC), and some polyamides), silica or silicon oxide (e.g., $SiO_2$), fused silica, silica-based materials, silicon nitride ($Si_3N_4$), resins, or the like. Examples of resins that can transmit UV light include inorganic oxides, such as tantalum pentoxide (e.g., $Ta_2O_5$) or other tantalum oxide(s) ($TaO_x$), aluminum oxide (e.g., $Al_2O_3$), silicon oxide (e.g., $SiO_2$), hafnium oxide (e.g., $HfO_2$), indium tin oxide, titanium dioxide, etc., or polymeric resins, such as a polyhedral oligomeric silsesquioxane based resin (e.g., POSS® from Hybrid Plastics), a non-polyhedral oligomeric silsesquioxane epoxy resin, a poly(ethylene glycol) resin, a polyether resin (e.g., ring opened epoxies), an acrylic resin, an acrylate resin, a methacrylate resin, an amorphous fluoropolymer resin (e.g., CYTOP® from Bellex), and combinations thereof. In some examples, the resin used has a UV transmittance (at the UV dosage being used) that ranges from about 0.5 to about 1, e.g., from about 0.75 to about 1, from about 0.9 to about 0.99. The thickness of the resin that is used can be adjusted so that the entire resin exhibits the desired UV transmittance for the UV dosage being used. In some instances, the resin thickness is 1 μm or less. In other instances, the resin thickness is 150 nm or less.

As mentioned, examples of the multi-layered structure (i.e., substrate 18) include a base support 28 and at least one other layer 30 thereon. In examples of the method disclosed herein that do not utilize backside light exposure, any example of the single layer base support (i.e., substrate 16) may be used as the base support 28. In these examples, the other layer 30 may be any material that can be etched or imprinted to form the depressions 20. Examples of the layer 30 include inorganic oxides, such as tantalum oxide (e.g., $Ta_2O_5$), aluminum oxide (e.g., $Al_2O_3$), silicon oxide (e.g., $SiO_2$), or hafnium oxide (e.g., $HfO_2$), or polymeric resins, such as a polyhedral oligomeric silsesquioxane based resin (e.g., POSS® from Hybrid Plastics), a non-polyhedral oligomeric silsesquioxane epoxy resin, a poly(ethylene glycol) resin, a polyether resin (e.g., ring opened epoxies), an acrylic resin, an acrylate resin, a methacrylate resin, an amorphous fluoropolymer resin (e.g., CYTOP® from Bellex), and combinations thereof.

In examples of the method disclosed herein that utilize backside light exposure, the base support 28 and the other layer 30 may respectively be any material that is capable of transmitting the light that is used to pattern an overlying photoresist (e.g., ultraviolet light) and that is used in nucleic acid sequencing (e.g., ultraviolet light and visible light). In these particular examples, suitable transparent materials for the base support 28 include siloxanes, glass, modified or functionalized glass, polymers (including acrylics, polystyrene and copolymers of styrene and other materials, polyethylene terephthalate (PET), polycarbonate, cyclic olefin copolymer (COC), and some polyamides), silica or silicon oxide (e.g., $SiO_2$), fused silica, silica-based materials, silicon nitride ($Si_3N_4$), resins, or the like. The other layer 30 may be any of the resins set forth herein that can transmit UV light.

In any of the examples set forth herein, the substrate 16 or the base support 28 may be a circular sheet, a panel, a wafer, a die, etc. having a diameter ranging from about 2 mm to about 300 mm, e.g., from about 200 mm to about 300 mm, or may be a rectangular sheet, panel, wafer, die etc. having its largest dimension up to about 10 feet (~3 meters). As one example, a die may have a width ranging from about 0.1 mm to about 10 mm. While example dimensions have been provided, it is to be understood that the substrate 16 or the base support 28 may have any suitable dimensions.

As mentioned, the architecture within the flow channel 12 of the flow cell 10 is depicted in FIG. 2B. Depressions 20 are defined in the substrate 16 or in the layer 30 of the substrate 18.

Many different layouts of the depressions 20 may be envisaged, including regular, repeating, and non-regular patterns. In an example, the depressions 20 are disposed in a hexagonal grid for close packing and improved density. Other layouts may include, for example, rectilinear (rectangular) layouts, triangular layouts, and so forth. In some examples, the layout or pattern can be an x-y format in rows and columns. In some other examples, the layout or pattern can be a repeating arrangement of the depressions 20 and the interstitial regions 32. In still other examples, the layout or pattern can be a random arrangement of the depressions 20 and the interstitial regions 32.

The layout or pattern may be characterized with respect to the density (number) of the depressions 20 in a defined area. For example, the depressions 20 may be present at a density of approximately 2 million per $mm^2$. The density may be tuned to different densities including, for example, a density of about 100 per $mm^2$, about 1,000 per $mm^2$, about 0.1 million per $mm^2$, about 1 million per $mm^2$, about 2 million per $mm^2$, about 5 million per $mm^2$, about 10 million per $mm^2$, about 50 million per $mm^2$, or more, or less. It is to be further understood that the density can be between one of the lower values and one of the upper values selected from the ranges above, or that other densities (outside of the given ranges) may be used. As examples, a high density array may be characterized as having the depressions 20 separated by less than about 100 nm, a medium density array may be characterized as having the depressions 20 separated by about 400 nm to about 1 μm, and a low density array may be characterized as having the depressions 20 separated by greater than about 1 μm.

The layout or pattern of the depressions 20 may also or alternatively be characterized in terms of the average pitch, or the spacing from the center of one depression 20 to the center of an adjacent depression 20 (center-to-center spacing) or from the right edge of one depression 20 to the left edge of an adjacent depression 20. The pattern can be regular, such that the coefficient of variation around the average pitch is small, or the pattern can be non-regular in which case the coefficient of variation can be relatively large. In either case, the average pitch can be, for example, about 50 nm, about 0.15 μm, about 0.5 μm, about 1 μm, about 5 μm, about 10 μm, about 100 μm, or more or less. The average pitch for a particular pattern of depressions 20 can be between one of the lower values and one of the upper values selected from the ranges herein. In an example, the depressions 20 have a pitch (center-to-center spacing) of about 1.5 μm. While example average pitch values have been provided, it is to be understood that other average pitch values may be used.

The size of each depression 20 may be characterized by its volume, opening area, depth, and/or diameter. For example, the volume can range from about $1\times10^{-3}$ $\mu m^3$ to about 100 $\mu m^3$, e.g., about $1\times10^{-2}$ $\mu m^3$, about 0.1 $\mu m^3$, about 1 $\mu m^3$, about 10 $\mu m^3$, or more, or less. For another example, the opening area can range from about $1\times10^{-3}$ $\mu m^2$ to about 100 $\mu m^2$, e.g., about $1\times10^{-2}$ $\mu m^2$, about 0.1 $\mu m^2$, about 1 $\mu m^2$, at least about 10 $\mu m^2$, or more, or less. For still another example, the depth can range from about 0.1 μm to about 100 μm, e.g., about 0.5 μm, about 1 μm, about 10 μm, or more, or less. For another example, the depth can range from about 0.1 μm to about 100 μm, e.g., about 0.5 μm, about 1 μm, about 10 μm, or more, or less. For yet another example, the diameter or length and width can range from about 0.1 μm to about 100 μm, e.g., about 0.5 μm, about 1 μm, about 10 μm, or more, or less.

The architecture also includes the functionalized layers 24, 26. In each example, the functionalized layers 24, 26 represent areas that have a primer set attached thereto. As depicted, the architecture includes two different primer sets, shown at 50, 52 in FIG. 2B, 50A, 52A in FIG. 3A, or 50B, 52B in FIG. 3B. The primer sets 50, 52 (e.g., 50A, 52A or 50B, 52B) are used in simultaneous paired-end sequencing. It is to be understood that 50A or 50B may be attached to functionalized layer 24 or functionalized layer 26, so long as the primer set 52A or 52B is attached to the other of the functionalized layers 26, 24.

In some of the examples disclosed herein, the functionalized layers 24, 26 are chemically the same, and any of the techniques disclosed herein may be used to immobilize the primer sets 50, 52 to the desired layer 24, 26. In other examples disclosed herein, the functionalized layers 24, 26 are chemically different (e.g., include different functional groups for respective primer set 50, 52 attachment), and any of the techniques disclosed herein may be used to immobilize the primer sets 50, 52 to the respective layers 24, 26. In other examples disclosed herein, the materials applied to form the functionalized layers 24, 26 may have the respective primer sets 50, 52 pre-grafted thereto, and thus the immobilization chemistries of the functionalized layers 24, 26 may be the same or different.

The functionalized layers 24, 26 may be any gel material that can swell when liquid is taken up and that can contract when liquid is removed, e.g., by drying. In an example, the gel material is an acrylamide copolymer. Some examples of the acrylamide copolymer are represented by the following structure (I):

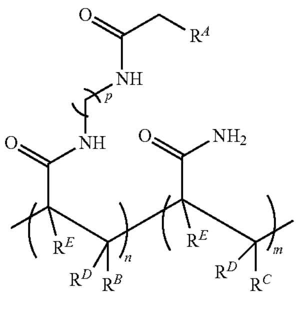

wherein:

$R^A$ is selected from the group consisting of azido, optionally substituted amino, optionally substituted alkenyl, optionally substituted alkyne, halogen, optionally substituted hydrazone, optionally substituted hydrazine, carboxyl, hydroxy, optionally substituted tetrazole, optionally substituted tetrazine, nitrile oxide, nitrone, sulfate, and thiol;

$R^B$ is H or optionally substituted alkyl;

$R^C$, $R^D$, and $R^E$ are each independently selected from the group consisting of H and optionally substituted alkyl;

each of the $-(CH_2)_p-$ can be optionally substituted;

p is an integer in the range of 1 to 50;

n is an integer in the range of 1 to 50,000; and m is an integer in the range of 1 to 100,000.

One specific example of the acrylamide copolymer represented by structure (I) is poly(N-(5-azidoacetamidylpentyl)acrylamide-co-acrylamide, PAZAM.

One of ordinary skill in the art will recognize that the arrangement of the recurring "n" and "m" features in structure (I) are representative, and the monomeric subunits may be present in any order in the polymer structure (e.g., random, block, patterned, or a combination thereof). The molecular weight of the acrylamide copolymer may range from about 5 kDa to about 1500 kDa or from about 10 kDa to about 1000 kDa, or may be, in a specific example, about 312 kDa.

In some examples, the acrylamide copolymer is a linear polymer. In some other examples, the acrylamide copolymer is a lightly cross-linked polymer.

In other examples, the gel material may be a variation of structure (I). In one example, the acrylamide unit may be replaced with N,N-dimethylacrylamide ( 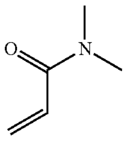 ).

In this example, the acrylamide unit in structure (I) may be replaced with,

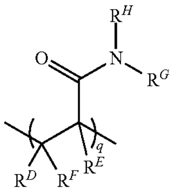

where $R^D$, $R^E$, and $R^F$ are each H or a C1-C6 alkyl, and $R^G$ and $R^H$ are each a C1-C6 alkyl (instead of H as is the case with the acrylamide). In this example, q may be an integer in the range of 1 to 100,000. In another example, the N,N-dimethylacrylamide may be used in addition to the acrylamide unit. In this example, structure (I) may include

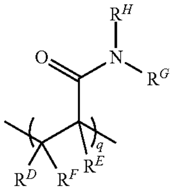

in addition to the recurring "n" and "m" features, where $R^D$, $R^E$, and $R^F$ are each H or a C1-C6 alkyl, and $R^G$ and $R^H$ are each a C1-C6 alkyl. In this example, q may be an integer in the range of 1 to 100,000.

As another example of the gel material, the recurring "n" feature in structure (I) may be replaced with a monomer including a heterocyclic azido group having structure (II):

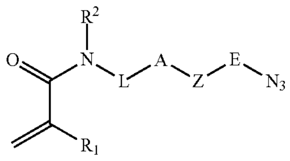

wherein $R^1$ is H or a C1-C6 alkyl; $R_2$ is H or a C1-C6 alkyl; L is a linker including a linear chain with 2 to 20 atoms selected from the group consisting of carbon, oxygen, and nitrogen and 10 optional substituents on the carbon and any nitrogen atoms in the chain; E is a linear chain including 1 to 4 atoms selected from the group consisting of carbon, oxygen and nitrogen, and optional substituents on the carbon and any nitrogen atoms in the chain; A is an N substituted amide with an H or a C1-C4 alkyl attached to the N; and Z is a nitrogen containing heterocycle. Examples of Z include 5 to 10 carbon-containing ring members present as a single cyclic structure or a fused structure. Some specific examples of Z include pyrrolidinyl, pyridinyl, or pyrimidinyl.

As still another example, the gel material may include a recurring unit of each of structure (III) and (IV):

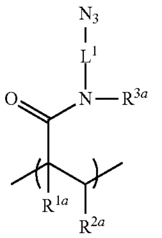

and

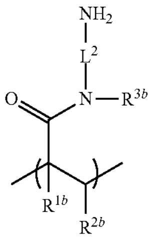

wherein each of $R^{1a}$, $R^{2a}$, $R^{1b}$ and $R^{2b}$ is independently selected from hydrogen, an optionally substituted alkyl or optionally substituted phenyl; each of $R^{3a}$ and $R^{3b}$ is independently selected from hydrogen, an optionally substituted alkyl, an optionally substituted phenyl, or an optionally substituted C7-C14 aralkyl; and each $L^1$ and $L^2$ is independently selected from an optionally substituted alkylene linker or an optionally substituted heteroalkylene linker.

In still another example, the acrylamide copolymer is formed using nitroxide mediated polymerization, and thus at least some of the copolymer chains have an alkoxyamine end group. In the copolymer chain, the term "alkoxyamine end group" refers to the dormant species $-ONR_1R_2$, where each of $R_1$ and $R_2$ may be the same or different, and may independently be a linear or branched alkyl, or a ring structure, and where the oxygen atom is attached to the rest of the copolymer chain. In some examples, the alkoxyamine may also be introduced into some of the recurring acrylamide monomers, e.g., at position $R^A$ in structure (I). As such, in one example, structure (I) includes an alkoxyamine end group; and in another example, structure (I) includes an alkoxyamine end group and alkoxyamine groups in at least some of the side chains.

It is to be understood that other molecules may be used to form the functionalized layers 24, 26, as long as they are capable of being functionalized with the desired chemistry, e.g., primer set(s) 50, 52. Some examples of suitable materials for the functionalized layers 24, 26 include functionalized silanes, such as norbornene silane, azido silane, alkyne functionalized silane, amine functionalized silane, maleimide silane, or any other silane having functional groups that can respectively attach the desired chemistry. Still other examples of suitable materials for the functionalized layers 24, 26 include those having a colloidal structure, such as agarose; or a polymer mesh structure, such as gelatin; or a cross-linked polymer structure, such as polyacrylamide polymers and copolymers, silane free acrylamide (SFA), or an azidolyzed version of SFA. Examples of suitable polyacrylamide polymers may be synthesized from acrylamide and an acrylic acid or an acrylic acid containing a vinyl group, or from monomers that form [2+2] photo-cycloaddition reactions. Still other examples of suitable materials for the functionalized layers 24, 26 include mixed copolymers of acrylamides and acrylates. A variety of polymer architectures containing acrylic monomers (e.g., acrylamides, acrylates etc.) may be utilized in the examples disclosed herein, such as branched polymers, including dendrimers (e.g., multi-arm or star polymers). For example, the monomers (e.g., acrylamide, acrylamide, etc.) may be incorporated, either randomly or in block, into the branches (arms) of a dendrimer.

The gel material for the functionalized layers 24, 26 may be formed using any suitable copolymerization process, such as nitroxide mediated polymerization (NMP), reversible addition-fragmentation chain-transfer (RAFT) polymerization, etc.

The attachment of the functionalized layers 24, 26 to the underlying substrate 16 or layer 30 may be through covalent bonding. In some instances, the underlying substrate 16 or layer 30 may first be activated, e.g., through silanization or plasma ashing. Covalent linking is helpful for maintaining the primer set(s) 50, 52 in the desired regions throughout the lifetime of the flow cell 10 during a variety of uses.

In some of the examples disclosed herein, the functionalized layers 24, 26 are chemically the same, and some of the techniques disclosed herein may be used to immobilize the primer sets 50, 52 to the desired functionalized layers 24, 26. In other examples disclosed herein, the functionalized layers 24, 26 are chemically different (e.g., include different functional groups for respective primer set 50, 52 attachment), and some of the techniques disclosed herein may be used to immobilize the primer sets 50, 52 to the desired layer 24 or 26. In other examples disclosed herein, the materials applied to form the functionalized layers 24, 26 may have the respective primer sets 50, 52 pre-grafted thereto, and thus the immobilization chemistries of the layers 24, 26 may be the same or different.

Figure 3A:
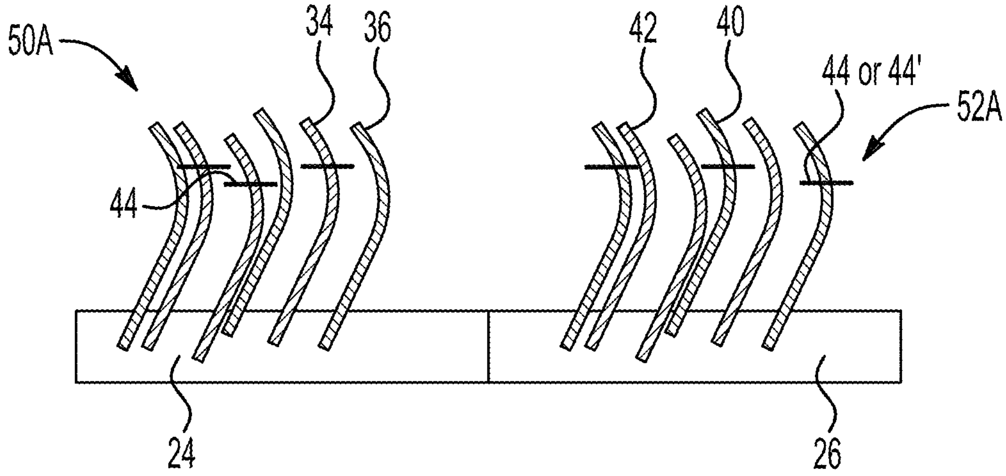
FIG. 3A is a schematic view of one example primer set that can be used in an example of the flow cell disclosed herein.

As noted, the architecture also includes the primer sets 50, 52 respectively attached to the functionalized layers 24, 26. Specific examples of the primers sets 50, 52 are shown in FIG. 3A as 50A, 52A and in FIG. 3B as 50B, 52B.

The primers sets 50A, 52A or 50B, 52B are related in that one set 50A, 50B includes a cleavable first primer 34, 34' and an uncleavable second primer 36, 36' and the other set 52A, 52B includes an uncleavable first primer 42, 42' and a cleavable second primer 40, 40'. These primer sets 50A, 52A or 50B, 52B allow a single template strand to be amplified and clustered across both primer sets 50A, 52A or 50B, 52B, and also enable the respective generation of forward and reverse strands on the functionalized layer 24, 26 due to the cleavage groups 44 and 44 or 44' being present on the opposite primers of the sets 50A, 52A or 50B, 52B. It is to be understood that the prime (') designations for the primers 34', 36', 40', 42' do not refer to complementary sequences to the primers 34, 36, 40, 42, but rather are additional examples of the type of primer.

Each of the first primer sets 50A, 50B includes a cleavable first primer 34 or 34' and an uncleavable second primer 36 or 36'; and each of the second primer sets 52A, 52B includes an uncleavable first primer 42 or 42' and a cleavable second primer 40 or 40'.

The uncleavable second primer 36 or 36' and the cleavable first primer 34 or 34' are oligonucleotide pairs, e.g., where the uncleavable second primer 36 or 36' is a forward amplification primer and the cleavable first primer 34 or 34' is a reverse amplification primer or where the uncleavable second primer 36 or 36' is the reverse amplification primer and the cleavable first primer 34 or 34' is the forward amplification primer. In each example of the primer set 50A, 50B, the cleavable first primer 34 or 34' includes a cleavage site 44, while the uncleavable second primer 36 or 36' does not include a cleavage site 44.

The cleavable second primer 40 or 40' and the uncleavable first primer 42 or 42' are also oligonucleotide pairs, e.g., where the cleavable second primer 40 or 40' is a forward amplification primer and the uncleavable first primer 42 or 42' is a reverse amplification primer or where the uncleavable first primer 42 or 42' is the forward amplification primer and the cleavable second primer 40 or 40' is the reverse amplification primer. In each example of the second primer set 52A, 52B, the cleavable second primer 40 or 40' includes a cleavage site 44 or 44', while the uncleavable first primer 42 or 42' does not include a cleavage site 44 or 44'.

It is to be understood that the uncleavable second primer 36 or 36' of the first primer set 50A, 50B and the cleavable second primer 40 or 40' of the second primer set 52A, 52B, have the same nucleotide sequence (e.g., both are forward amplification primers), except that the cleavable second primer 40 or 40' includes the cleavage site 44 or 44' integrated into the nucleotide sequence or into a linker 46 or 46' attached to the nucleotide sequence. Similarly, the cleavable first primer 34 or 34' of the first primer set 50A, 50B and the uncleavable first primer 42 or 42' of the second primer set 52A, 52B have the same nucleotide sequence (e.g., both are reverse amplification primers), except that the cleavable first primer 34 or 34' includes the cleavage site 44 integrated into the nucleotide sequence or into a linker 46 attached to the nucleotide sequence.

It is to be understood that when the first primers 34 and 42 or 34' and 42' are forward amplification primers, the second primers 36 and 40 or 36' and 40' are reverse primers, and vice versa.

The uncleavable primers 36, 42 or 36', 42' may be any primers with a universal sequence for capture and/or amplification purposes, such as P5 and P7 primers, or any combination of PA, PB, PC, and PD primers (e.g., PA and PB or PA and PD, etc.).

Examples of the P5 and P7 primers are used on the surface of commercial flow cells sold by Illumina Inc. for sequencing, for example, on HISEQ™, HISEQX™, MISEQ™, MISEQDX™, MINISEQ™, NEXTSEQ™, NEXTSEQDX™, NOVASEQ™, ISEQ™, GENOME ANALYZER™, and other instrument platforms. The uncleavable P5 primer is:

```
uncleavable P5: 5' → 3'
                                    (SEQ. ID. NO. 1)
AATGATACGGCGACCACCGAGACTACAC
```

The uncleavable P7 primer may be any of the following:

```
uncleavable P7 #1: 5' → 3'
                                    (SEQ. ID. NO. 2)
CAAGCAGAAGACGGCATACGAAT

uncleavable P7 #2: 5' → 3'
                                    (SEQ. ID. NO. 3)
CAAGCAGAAGACGGCATACAGAT
```

The other uncleavable primers (PA-PD) mentioned above include:

```
uncleavable PA 5' → 3'
                                    (SEQ. ID. NO. 4)
GCTGGCACGTCCGAACGCTTCGTTAATCCGTTGAG

uncleavable PB 5' → 3'
                                    (SEQ. ID. NO. 5)
CGTCGTCTGCCATGGCGCTTCGGTGGATATGAACT

uncleavable PC 5' → 3'
                                    (SEQ. ID. NO. 6)
ACGGCCGCTAATATCAACGCGTCGAATCCGCAACT

uncleavable PD 5' → 3'
                                    (SEQ. ID. NO. 7)
GCCGCGTTACGTTAGCCGGACTATTCGATGCAGC
```

These primers are uncleavable primers 36, 42 or 36', 42' because they do not include a cleavage site 44, 44'. It is to be understood that any suitable universal sequence can be used as the uncleavable primers 36, 42 or 36', 42'.

Examples of cleavable primers 34, 40 or 34', 40' include the P5 and P7 primers or other universal sequence primers (e.g., the P15, PA, PB, PC, PD primers) with the respective cleavage sites 44, 44', incorporated into the respective nucleic acid sequences (FIG. 3A), or into the linker 46, 46' (FIG. 3B) that attaches the cleavable primers 34, 40 or 34', 40' to the functionalized layer 24, 26. Examples of suitable cleavage sites 44, 44' include enzymatically cleavable nucleobases or chemically cleavable nucleobases, modified nucleobases, or other cleavable molecules (e.g., between nucleobases). Some specific examples of the cleavage sites 44, 44' include uracil, 8-oxoguanine, or allyl-T (a thymine nucleotide analog having an allyl functionality). The cleavage sites 44, 44' may be incorporated at any point in the strand or in the linker 46, 46'.

Some specific examples of the cleavable primers 34, 40 or 34', 40' are shown below, where the cleavage site is shown at "n":

```
cleavable P5 #1: 5' → 3'
                                    (SEQ. ID. NO. 8)
AATGATACGGCGACCACCGAGAUCTACAC

cleavable P5 #2: 5' → 3'
                                    (SEQ. ID. NO. 9)
AATGATACGGCGACCACCGAGAnCTACAC
```

wherein "n" is alkene-thymidine (i.e., alkene-dT) in the sequence.

The cleavable P7 primer may be any of the following:

```
P7 #1: 5' → 3'
                                    (SEQ. ID. NO. 10)
CAAGCAGAAGACGGCATACGAnAT

P7 #2: 5' → 3'
                                    (SEQ. ID. NO. 11)
CAAGCAGAAGACGGCATACnAGAT

P7 #3: 5' → 3'
                                    (SEQ. ID. NO. 12)
CAAGCAGAAGACGGCATACnAnAT
```

where "n" is 8-oxoguanine in each of the sequences.

The cleavable P15 primer is:

```
P15: 5' → 3'
                                    (SEQ. ID. NO. 13)
AATGATACGGCGACCACCGAGAnCTACAC
```

wherein "n" is allyl T.

In any of the examples disclosed herein, the primer set 50A, 50B, 52A, of 52B may also include a PX primer for capturing a library template seeding molecule. The density of the PX motifs should be relatively low in order to minimize polyclonality within each depression 20. The PX capture primer may be:

```
PX 5' → 3'
                                    (SEQ. ID. NO. 14)
AGGAGGAGGAGGAGGAGGAGGAGG
```

Figure 3B:
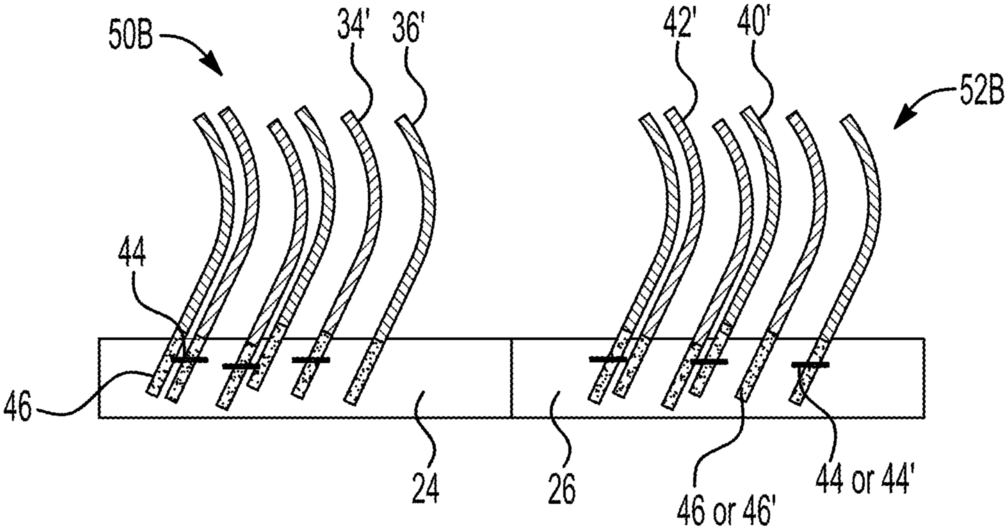
FIG. 3B is a schematic view of another example primer set that can be used in an example of the flow cell disclosed herein.

FIG. 3A and FIG. 3B depict different configurations of the primer sets 50A, 52A, 50B, 52B attached to the functionalized layers 24, 26. More specifically, FIG. 3A and FIG. 3B depict different configurations of the primers 34, 36 or 34', 36' and 40, 42 or 40', 42' that may be used.

In the example shown in FIG. 3A, the primers 34, 36 and 40, 42 of the primer sets 50A and 52A are directly attached to the respective functionalized layers 24, 26, for example, without a linker 46, 46'. The functionalized layers 24, 26 have surface functional groups that can immobilize the terminal groups at the 5' end of the respective primers 34, 36 and 40, 42.

Also, in the example shown in FIG. 3A, the cleavage site 44, 44' of each of the cleavable primers 34, 40 is incorporated into the sequence of the primer 34, 40. It is to be understood that the same type of cleavage site 44 or different types of cleavage sites 44, 44' may be used in the cleavable primers 34, 40 of the respective primer sets 50A, 52A. As an example, the cleavage sites 44 are uracil bases, and the cleavable primers 34, 40 are P5U and P7U, respectively. It is to be understood that any other cleavable nucleotide that can be incorporated by a polymerase may be used as the cleavage site 44. The uracil bases or other cleavage sites may also be incorporated into any of the PA, PB, PC, and PD primers to generate the cleavable primers 34, 40. In this example, the uncleavable primer 36 of the oligonucleotide pair 34, 36 may be P7, and the uncleavable primer of the oligonucleotide pair 40, 42 may be P5. Thus, in this example, the first primer set 50A includes P7, P5U and the second primer set 52A includes P5, P7U. The primer sets 50A, 52A have opposite linearization chemistries, which, after amplification, cluster generation, and linearization, allows forward template strands to be formed on one of the functionalized layers 26 and reverse strands to be formed on the other the functionalized layers 24.

In the example shown in FIG. 3B, the primers 34', 36' and 40', 42' of the primer sets 50B and 52B are attached to the respective functionalized layers 24, 26 through linkers 46 or 46, 46'. The functionalized layer 24 has surface functional groups that can immobilize the terminal groups of the linkers 46 at the 5' end of the primers 34', 36'. The functionalized layer 26 has surface functional groups that can immobilize the terminal groups of the linkers 46 or 46' at the 5' end of the primers 40', 42'.

Examples of suitable linkers 46, 46' may include nucleic acid linkers (e.g., 10 nucleotides or less) or non-nucleic acid linkers, such as a polyethylene glycol chain, an alkyl group or a carbon chain, an aliphatic linker with vicinal diols, a peptide linker, etc. An example of a nucleic acid linker is a polyT spacer, although other nucleotides can also be used. In one example, the spacer is a 6T to 10T spacer. The following are some examples of nucleotides including non-nucleic acid linkers with terminal alkyne groups (where B is the nucleobase and "oligo" is the primer sequence):

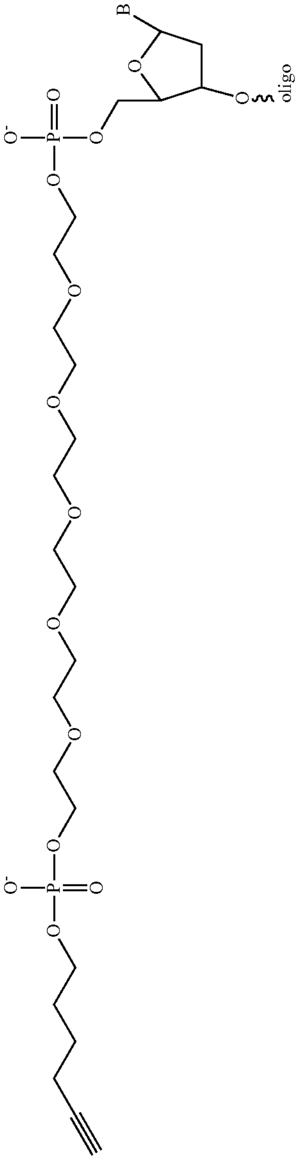
5' Hexynyl-HEG-oligo
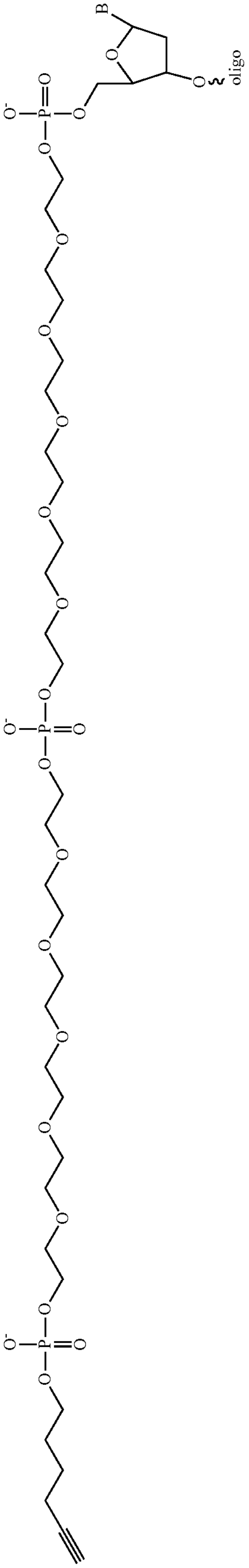
5' Hexynyl-HEG-HEG-oligo
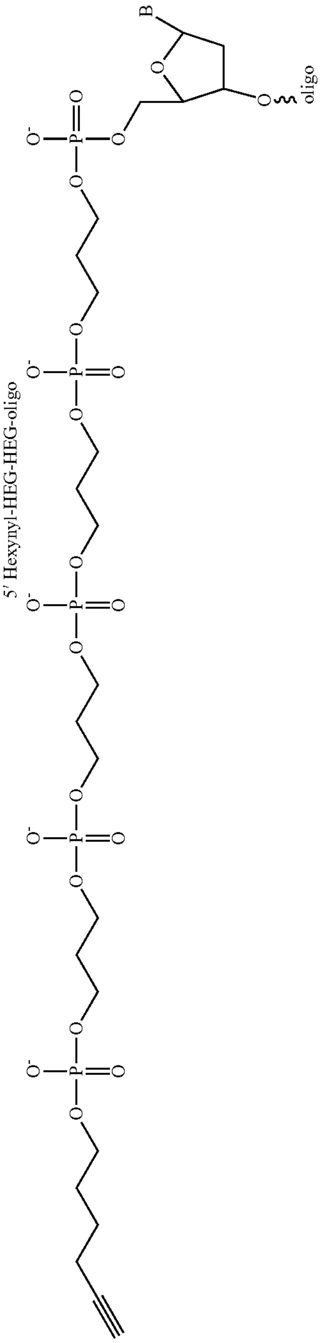
5' Hexynyl-C3 spacer-C3 spacer-C3 spacer-C3 spacer-oligo In the example shown in FIG. 3B, the primers 34', 42' have the same sequence (e.g., P5) and the same linkers 46 or different linkers 46, 46'. The primer 42' is uncleavable, whereas the primer 34' includes the cleavage site 44 incorporated into the linker 46. Also in this example, the primers 36', 40' have the same sequence (e.g., P7) and the same linkers 46 or different linkers 46, 46'. The primer 36' is uncleavable, and the primer 40' includes the cleavage site 44 or 44' incorporated into the linker 46 or 46'. The same type of cleavage site 44 or different types of cleavage sites 44, 44' may be used in the linkers 46 or 46, 46' of the cleavable primers 34', 40'. The primer sets 50B, 52B have opposite linearization chemistries, which, after amplification, cluster generation, and linearization, allows forward template strands to be formed on one of the functionalized layers 26 and reverse strands to be formed on the other of the functionalized layers 24.

While the cleavage sites 44 or 44, 44' are shown as part of the linkers 46 or 46, 46' in FIG. 3B, it is to be understood that the cleavage sites 44 or 44, 44' of the primers 34', 40' may be incorporated into the primer sequence rather than into the linkers 46 or 46, 46'.

In the examples shown in FIG. 3A and FIG. 3B, the attachment of the primers 34, 36 and 40, 42 or 34', 36' and 40', 42' to the functionalized layers 24, 26 leaves a template-specific portion of the primers 34, 36 and 40, 42 or 34', 36' and 40', 42' free to anneal to its cognate template and the 3' hydroxyl group free for primer extension.

Different methods may be used to generate the flow cell architecture disclosed herein. The various methods will now be described.

Methods for Making Flow Cells

The architecture within the flow cell 10 may be obtained through a variety of methods.

In the following description of each of the methods, the substrate 16 or 18 may be used. The initial figure in each series, e.g., FIG. 4A, FIG. 5A, FIG. 6A, and FIG. 7A, depicts the base support 28 of the multi-layer substrate 18, but this component is not depicted in subsequent figures for ease of illustration. It is to be understood that if the multi-layer substrate 18 is utilized, the base support 28 supports the layer 30 throughout the method and is part of the final patterned structure 14 (as shown in FIG. 2B).

Methods with Front Side Exposure

Some examples of the method utilize front side UV light exposure. Two different example methods are shown in FIG. 4A through FIG. 4F and in FIG. 5A through FIG. 5E.

The example method shown in FIG. 4A though FIG. 4F includes depositing a positive photoresist 38 over a substrate 16, 18, including depressions 20 separated by interstitial regions 32 (FIG. 4B); exposing the positive photoresist 38 to ultraviolet light at an angle that is non-perpendicular, non-parallel, and offset from a surface plane 48 of the depressions 20 such that a first portion (38, S) of the positive photoresist 38 in each depression 20 remains soluble and a second portion (38, I) of the positive photoresist 38 in each depression is rendered insoluble (FIG. 4B); removing the soluble portions of the positive photoresist 38, S, thereby exposing a first substrate portion 54 in each depression 20 (FIG. 4C); depositing a first functionalized layer 24 over the first substrate portion 54 in each depression 20 (FIG. 4D); removing the insoluble portions of the positive photoresist 38, I, thereby exposing a second substrate portion 56 in each depression 20 (FIG. 4E); and selectively applying the second functionalized layer 26 over second substrate portion 56 in each depression 20 (FIG. 4E). FIG. 4F depicts the structure after the functionalized layer 24 is removed from the interstitial regions 32.

As shown in FIG. 4A, the depression 20 is defined in either the single layer base support (substrate 16) or the other layer 30 of the multi-layered substrate 18.

The depression 20 may be dry etched, imprinted, or defined in the substrate 16 or layer 30 using any suitable technique. In one example, dry etching is used. In another example, nanoimprint lithography is used. In the latter example, a working stamp is pressed into the substrate 16 or layer 30 while the material is soft, which creates an imprint (negative replica) of the working stamp features in the substrate 16 or layer 30. The substrate 16 or layer 30 may then be cured with the working stamp in place.

Curing may be accomplished by exposure to actinic radiation, such as visible light radiation or ultraviolet (UV) radiation, when a radiation-curable resin material is used; or by exposure to heat when a thermal-curable resin material is used. Curing may promote polymerization and/or cross-linking. As an example, curing may include multiple stages, including a softbake (e.g., to drive off any liquid carrier that may be used to deposit the resin) and a hardbake. The softbake may take place at a lower temperature, ranging from about 50° C. to about 150° C., for greater than 0 seconds to about 3 minutes. The duration of the hardbake may last from about 5 seconds to about 10 minutes at a temperature ranging from about 100° C. to about 300° C. Examples of devices that can be used for softbaking and/or hardbaking include a hot plate, oven, etc.

After curing, the working stamp is released. This creates topographic features in the substrate 16 or layer 30. In this example, the topographic features of the depression 20 include the sidewalls 29 and the surface plane 48 at the bottom.

While one depression 20 is shown in FIG. 4A, it is to be understood that the method may be performed to generate an array of depressions 20 separated by interstitial regions 32 across the surface of the substrate 16 or layer 30.

If the substrate 16 or layer 30 does not include surface groups to covalently attach to the functionalized layers 24, 26, the substrate 16 or layer 30 may first be activated, e.g., through silanization or plasma ashing. If the substrate 16 or layer 30 does include surface groups to covalently attach to the functionalized layers 24, 26, the activation process is not performed. As examples, the substrate 16 or layer 30 is $Ta_2O_5$ which can be silanized to generate surface groups to react with the functionalized layers 24, 26, or the substrate 16 or layer 30 is a polyhedral oligomeric silsesquioxane based resin which can be plasma ashed or silanized to generate surface groups to react with the functionalized layers 24, 26.

Referring specifically to FIG. 4B, the positive photoresist 38 is deposited over the substrate 16 or layer 30, including in the depression 20 and over the interstitial regions 32. Examples of suitable positive photoresists include the MICROPOSIT® S 1800 series or the AZ® 1500 series, both of which are available from Kayaku Advanced Materials, Inc. Another example of a suitable positive photoresist is SPR™-220 (from DuPont). The positive photoresist 38 may be applied using any suitable deposition technique disclosed herein.

The positive photoresist 38 is then exposed to an angled ultraviolet light dosage from the front side (i.e., not through the substrate 16, 18). The UV light is directed toward the positive photoresist 38 at an angle that is non-perpendicular to, non-parallel to, and offset from the surface plane 48 of the depression 20. Thus, the UV light exposure is slanted at an angle that is greater than 0° and less than 90° or greater than 90° and less than 180° relative to the surface plane 48. In one example, the angle at which the UV light is directed ranges from about 30° to about 55° or from about 125° to about 150° with respect to the surface plane 48 of the depression(s) 20. In the example shown in FIG. 4B, the UV light is directed at an angle of about 135° with respect to the planar surface 48.

The angled UV light exposure may be achieved by positioning the light source (e.g., a UV light emitting diode or UV lamp, not shown in the figures) at the desired angle with respect to the substrate 16 or layer 30, or by positioning the substrate 16 or layer 30 at the desired angle with respect to the light source.

In this example, the interstitial regions 32 create a shadow effect in the depression 20 where some (region 38, I) of the positive photoresist 38 is not exposed to UV light. Thus, the interstitial regions 32 block the light from reaching a portion of the positive photoresist 38 in the depression 20, and thus this portion becomes insoluble 38, I. The remainder of the positive photoresist 38 is exposed to the light and thus becomes soluble, 38, S.

FIG. 4C depicts the structure after the soluble positive photoresist 38, S is removed from the interstitial regions 32 and from the depression 20. The soluble positive photoresist 38, S is removed using any suitable developer. Examples of suitable developers for the positive photoresist 38 include aqueous-alkaline solutions, such as diluted sodium hydroxide, diluted potassium hydroxide, or an aqueous solution of the metal ion free organic TMAH (tetramethylammonium-hydroxide). The removal of the soluble positive photoresist 38, S exposes the first substrate (or layer) portion 54 within the depression 20. As depicted in FIG. 4C, the other substrate (or layer) portion 56 remains covered by the insoluble positive photoresist 38, I.

Referring specifically to FIG. 4D, the functionalized layer 24 is deposited over the insoluble positive photoresist 38, I and over the exposed portions of the substrate 16 or layer 30 (i.e., the portion 54, some of the sidewalls 29, and the interstitial regions 32). The functionalized layer 24 may be any of the gel materials described herein and may be applied using any suitable deposition technique. A curing process may be performed after deposition. The functionalized layer 24 covalently attaches to the exposed portions of the substrate 16 or layer 30. Covalent linking is helpful for maintaining the primer set(s) 50, 52 in the desired regions throughout the lifetime of the flow cell 10 during a variety of uses.

The insoluble positive photoresist 38, I is then removed in a lift-off process. The lift-off process may involve an organic solvent that is capable of dissolving or otherwise lifting off the insoluble positive photoresist 38, I. The insoluble positive photoresist 38, I may be lifted off with removers such as dimethylsulfoxide (DMSO) with sonication, an acetone wash, a propylene glycol monomethyl ether acetate wash, or an NMP (N-methyl-2-pyrrolidone) based stripper wash. The lift-off process removes i) at least 99% of the insoluble positive photoresist 38, I and ii) the functionalized layer 24 positioned thereon. The lift-off process does not remove the functionalized layer 24 attached to the substrate 16 or layer 30. Thus, the lift-off process exposes the other substrate (or layer) portion 56.

FIG. 4E depicts the second functionalized layer 26 deposited over the other substrate (or layer) portion 56. It is to be understood that the second functionalized layer 26 may also be deposited over exposed portions of the depression sidewall 29.

The second functionalized layer 26 may be any of the gel materials described herein and may be applied using any suitable deposition technique under high ionic strength conditions (e.g., in the presence of 10×PBS, NaCl, KCl, etc.). A curing process, as described herein, may be performed after deposition. When the deposition of the gel material of the functionalized layer 26 is performed under high ionic strength, the second functionalized layer 26 does not deposit on or adhere to the first functionalized layer 24. As such, the second functionalized layer 26 does not contaminate the first functionalized layer 24. The second functionalized layer 26 covalently attaches to the exposed portions of the substrate 16 or layer 30 in the depression 20.

As described in reference to FIG. 4C and FIG. 4D, removing the soluble portions of the positive photoresist 38, S exposes the interstitial regions 32 and the first functionalized layer 24 is also deposited over the interstitial regions 32; as such, the method further comprises polishing the first functionalized layer 24 from the interstitial regions 32. In FIG. 4F, the functionalized layer 24 that is positioned over the interstitial regions 32 is removed, e.g., using a polishing process. The polishing process may be performed with a chemical slurry (including, e.g., an abrasive, a buffer, a chelating agent, a surfactant, and/or a dispersant) which can remove the functionalized layer 24 from the interstitial regions 32 without deleteriously affecting the underlying substrate 16 or layer 30 at those regions 32. Alternatively, polishing may be performed with a solution that does not include the abrasive particles.

The chemical slurry may be used in a chemical mechanical polishing system to polish the surface of the interstitial regions 32. The polishing head(s)/pad(s) or other polishing tool(s) is/are capable of polishing the functionalized layer 24 that may be present over the interstitial regions 32 while leaving the functionalized layers 24, 26 in the depression(s) 20 at least substantially intact. As an example, the polishing head may be a Strasbaugh ViPRR II polishing head.

Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

While not shown, the method shown in FIG. 4A through FIG. 4F also includes attaching respective primer sets 50, 52 to the functionalized layers 24, 26. In some examples, the primers 34, 36 or 34', 36' (not shown in FIG. 4A through FIG. 4F) may be pre-grafted to the functionalized layer 24. Similarly, the primers 38, 40 or 38', 40' (not shown in FIG. 4A through FIG. 4F) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 4D). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted immediately after the second functionalized layer 26 is applied (e.g., at FIG. 4E or FIG. 4F) as long as i) the second functionalized layer 26 has different functional groups (than the first functionalized layer 24) for attaching the primers 38, 40 or 38', 40' or ii) any unreacted functional groups of the first functionalized layer 24 have been quenched, e.g., using the Staudinger reduction to amines or additional click reaction with a passive molecule such as hexynoic acid.

When grafting is performed during the method, grafting may be accomplished using any suitable grafting technique. As examples, grafting may be accomplished by flow through deposition (e.g., using a temporarily bound lid), dunk coating, spray coating, puddle dispensing, or by another suitable method. Each of these example techniques may utilize a primer solution or mixture, which may include the primer set 50 or 52, water, a buffer, and a catalyst. With any of the grafting methods, the primer sets 50 or 52 attach to the reactive groups of the functionalized layer 24, 26, and have no affinity for the interstitial regions 32.

While a single set of the functionalized layers 24, 26 is shown in FIG. 4F, it is to be understood that the method described in reference to FIG. 4A through FIG. 4F may be performed to generate an array of depressions 20 (each having functionalized layers 24, 26 therein) separated by interstitial regions 32 across the surface of the substrate 16 or layer 30 of substrate 18.

Figure 5A:
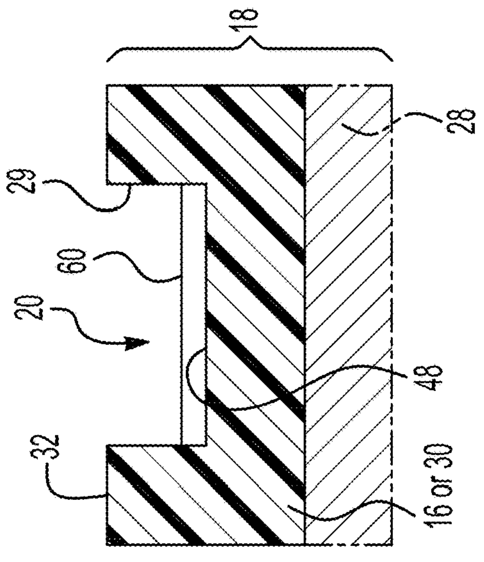
FIG. 5A through FIG. 5E together schematically depict an example method where.
Figure 5B:
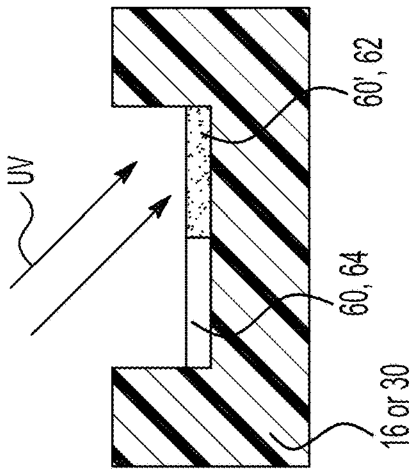
Figure 5C:
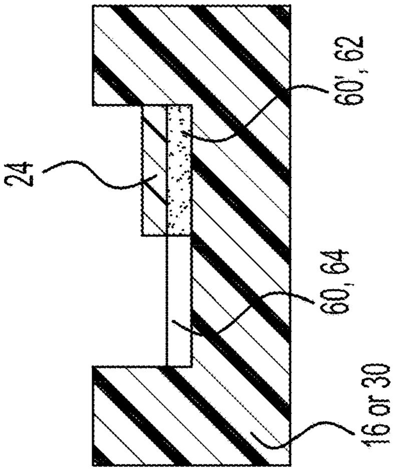
Figure 5D:
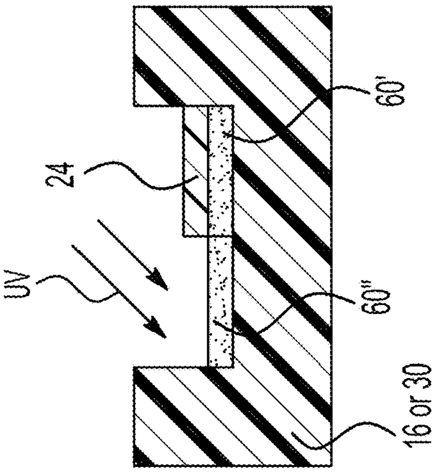
Figure 5E:
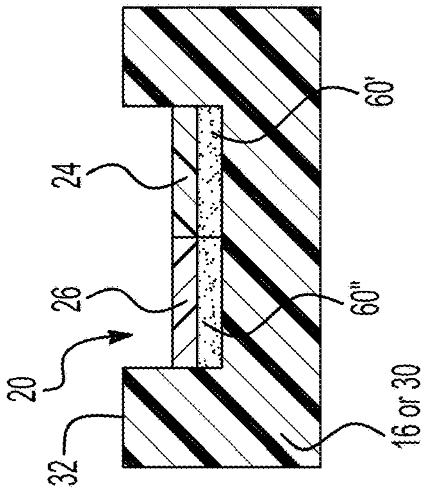

Referring now to FIG. 5A through FIG. 5E, another example method using front side UV exposure is depicted. This example method includes applying a photoactive layer 60 in depressions 20 of a substrate 16, 18 including the depressions 20 separated by interstitial regions 32 (FIG. 5A); exposing a first portion 62 of the photoactive layer 60 to ultraviolet light at a first angle that is non-perpendicular, non-parallel, and offset from a surface plane 48 of the depressions 20 such that the first portion 62 of the photoactive layer 60 in each depression 20 becomes active (represented by reference numeral 60') and a second portion 64 of the photoactive layer 60 in each depression 20 remains inactive (FIG. 5B); selectively attaching a first functionalized layer 24 to the first portion 62, 60' (FIG. 5C); exposing the second portion 64 of the photoactive layer 60 to ultraviolet light at a second angle that is non-perpendicular, non-parallel, and offset from the surface plane of the depressions 20 such that the second portion 64 of the photoactive layer 60 in each depression 20 becomes active (represented by reference numeral 60") (FIG. 5D); and selectively attaching a second functionalized layer 26 to the second portion 64, 60" (FIG. 5E).

As shown in FIG. 5A, the depression 20 is defined in either the single layer base support (substrate 16) or the other layer 30 of the multi-layered substrate 18. The depression 20 may be dry etched, imprinted, or defined in the substrate 16 or layer 30 using any suitable technique described herein.

While one depression 20 is shown in FIG. 5A, it is to be understood that the method may be performed to generate an array of depressions 20 separated by interstitial regions 32 across the surface of the substrate 16 or layer 30

As shown in FIG. 5A, a photoactive layer 60 is applied to the depressions 20. The photoactive layer 60 includes a photosensitive moiety that is activated upon exposure to ultraviolet radiation. In this example, the activation of the photosensitive moiety takes it from an inactive state, where it is unable to attach to the functional groups of the functionalized layer 24, to an active state, where it is able to attach to the functional groups of the functionalized layer 24. The photoactive layer 60 includes UV sensitive molecules that undergo chemical transformation during UV irradiation. In the examples disclosed herein, this photochemical transformation generates functional groups that can be used for a subsequent ligation reaction. As one example, with UV light irradiation, cyclopropenone-masked dibenzocyclooctyne would yield cyclooctynes that are substrates for click chemistry ligation (and thus could attach azides of the functionalized layer 24).

The photoactive layer 60 is blanketly deposited over the interstitial regions 32 and in the depressions 20 using any of the deposition techniques disclosed herein. The photoactive layer 60 is then polished from the interstitial regions 32 as described herein in reference to FIG. 4F. This leaves the photoactive layer 60 in the depressions 20 and leaves the interstitial regions 32 free of the photoactive layer 60.

The photoactive layer 60 is then exposed to an angled ultraviolet light dosage from the front side (i.e., not through the substrate 16, 18). The UV light is directed toward the photoactive layer 60 at an angle that is non-perpendicular to, non-parallel to, and offset from the surface plane 48 of the depression 20. Thus, the UV light exposure is slanted at an angle that is greater than 0° and less than 90° or greater than 90° and less than 180° relative to the surface plane 48. In one example, the angle at which the UV light is directed ranges from about 30° to about 55° or from about 125° to about 150° with respect to the surface plane 48 of the depression(s) 20. In the example shown in FIG. 5B, the UV light is directed at an angle of about 135° with respect to the planar surface 48.

The angled UV light exposure may be achieved by positioning the light source (e.g., a UV light emitting diode or UV lamp) at the desired angle with respect to the substrate 16 or layer 30, or by positioning the substrate 16 or layer 30 at the desired angle with respect to the light source.

In this example, the interstitial regions 32 create a shadow effect in the depression 20 where the second portion 64 of the photoactive layer 60 is not exposed to UV light. Thus, the interstitial regions 32 block the light from reaching a portion 64 of the photoactive layer 60 in the depression 20, and thus the portion 64 remains inactive. The remainder (i.e., portion 62) of the photoactive layer 60 is exposed to the light and thus becomes active, as shown at reference numeral 60'. As noted herein, activation renders the photoactive moieties of the portion 62 capable of attaching to functional groups of the functionalized layer 24.

Referring specifically to FIG. 5C, the functionalized layer 24 is then deposited over the activated photoactive layer 60' and cured. In this example, the substrate 16 or layer 30 has not been activated via silanization or polishing, and thus the functionalized layer 24 does not attach to the interstitial regions 32. Additionally, because the portion 64 of the photoactive layer 60 has not been activated, the functionalized layer 24 does not attach to the portion 64. Because of the different interactions at the activated photoactive layer 60' and at the regions 32 and the portion 64, the functionalized layer 24 covalently attaches to the activated photoactive layer 60', and can be easily removed (e.g., via sonication, washing, wiping, etc.) from the regions 32 and the portion 64 of the photoactive layer 60.

The portion 64 of the photoactive layer 60 is then exposed to an angled ultraviolet light dosage from the front side (i.e., not through the substrate 16, 18). The UV light is again directed toward the photoactive layer 60 at an angle that is non-perpendicular to, non-parallel to, and offset from the surface plane 48 of the depression 20, but this angle is specifically selected so that the UV light is directed at the previously unexposed portion 64. This is depicted in FIG. 5D. The UV light exposure is slanted at an angle that is greater than 0° and less than 90° or greater than 90° and less than 180° relative to the surface plane 48. In one example, the angle at which the UV light is directed ranges from about 30° to about 55° or from about 125° to about 150° with respect to the surface plane 48 of the depression(s) 20. In the example shown in FIG. 5D, the UV light is directed at an angle of about 45° with respect to the planar surface 48.

The angled UV light exposure may be achieved by positioning the light source (e.g., a UV light emitting diode or UV lamp) at the desired angle with respect to the substrate 16 or layer 30, or by positioning the substrate 16 or layer 30 at the desired angle with respect to the light source.

In this example, the interstitial regions 32 create a shadow effect in the depression 20 where the previously activated photoactive layer 60' (portion 62) is not exposed to UV light. The portion 64 of the photoactive layer 60 is exposed to the light and thus becomes active, as shown at reference numeral 60". Activation renders the photoactive moieties of the portion 64 capable of attaching to functional groups of the functionalized layer 26.

FIG. 5E depicts the second functionalized layer 26 deposited over the activated photoactive layer 60". The second functionalized layer 26 may be any of the gel materials described herein and may be applied using any suitable deposition technique under high ionic strength conditions (e.g., in the presence of 10×PBS, NaCl, KCl, etc.). A curing process, as described herein, may be performed after deposition. When the deposition of the gel material of the functionalized layer 26 is performed under high ionic strength, the second functionalized layer 26 does not deposit on or adhere to the first functionalized layer 24. As such, the second functionalized layer 26 does not contaminate the first functionalized layer 24. The second functionalized layer 26 does covalently attach to the activated moieties of the activated photoactive layer 60". In this example, the substrate 16 or layer 30 has not been activated via silanization or plasma ashing, and thus the functionalized layer 26 does not attach to the interstitial regions 32.

While not shown, the method shown in FIG. 5A through FIG. 5E also includes attaching respective primer sets 50, 52 to the functionalized layers 24, 26. In some examples, the primers 34, 36 or 34', 36' (not shown in FIG. 5A through FIG. 5E) may be pre-grafted to the functionalized layer 24. Similarly, the primers 38, 40 or 38', 40' (not shown in FIG. 5A through FIG. 5E) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 5C). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted immediately after the second functionalized layer 26 is applied (e.g., at FIG. 5E) as long as i) the functionalized layer 26 has different functional groups (than the functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

While a single set of the functionalized layers 24, 26 is shown in FIG. 5E, it is to be understood that the method described in reference to FIG. 5A through FIG. 5E may be performed to generate an array of depressions 20 (each having functionalized layers 24, 26 therein) separated by interstitial regions 32 across the surface of the substrate 16 or the layer 30 of the substrate 18.

Methods with Backside Exposure

Some examples of the method utilize backside UV light exposure. Several example methods are shown in the FIG. 6 series and the FIG. 7 series.

Figures 6A, 6B, 6C, 6D:
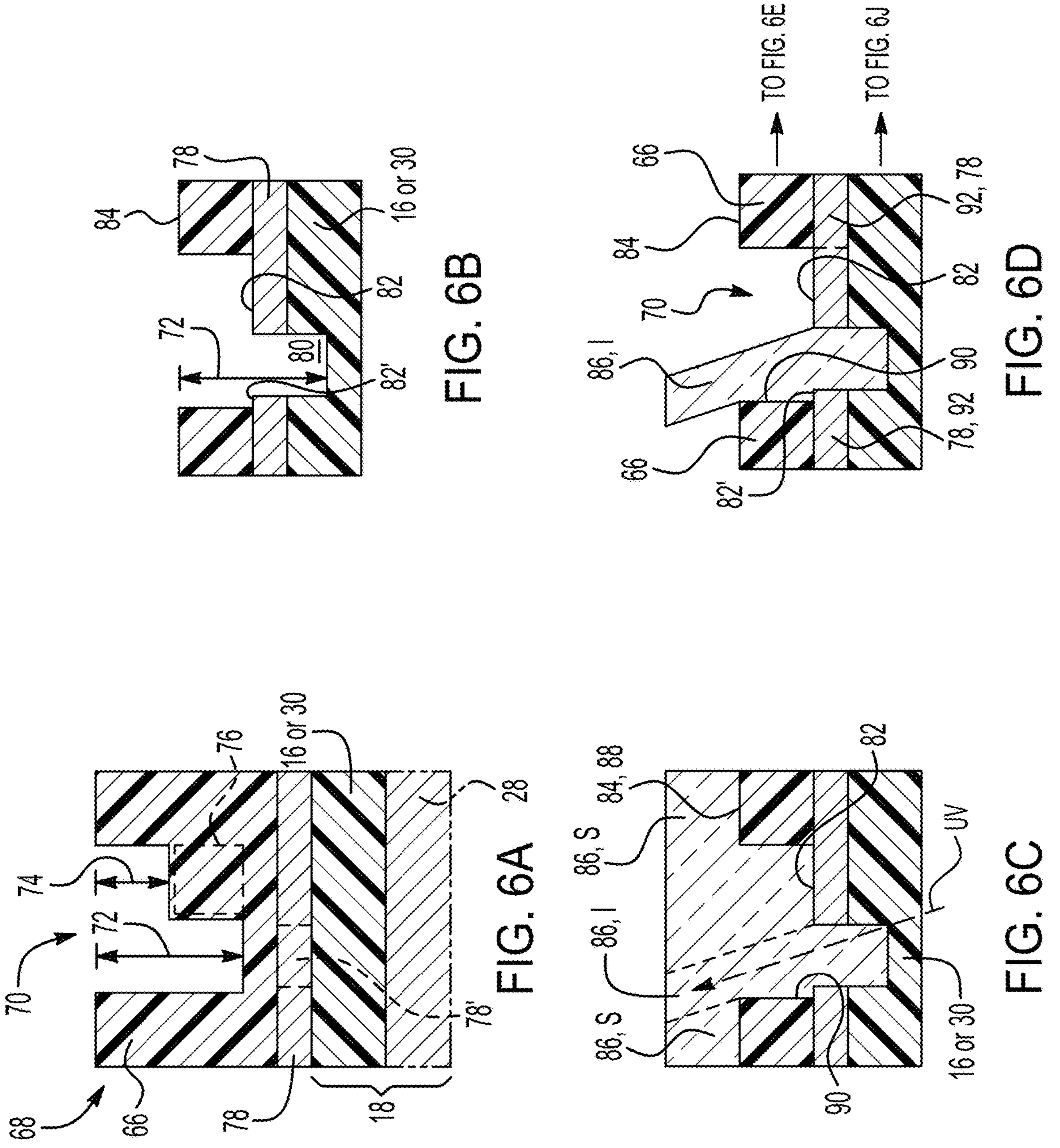
FIG. 6A through FIG. 6I together schematically depict an example method where.
Figure 6G:
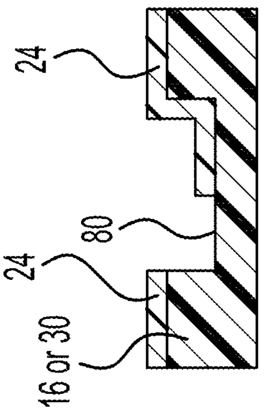
Figure 6F:
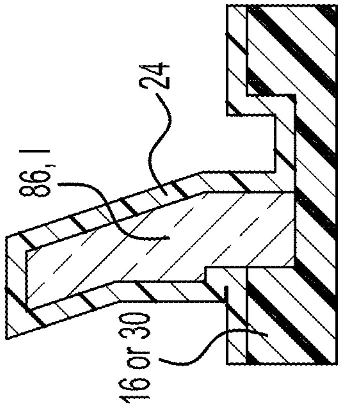
Figure 6E:
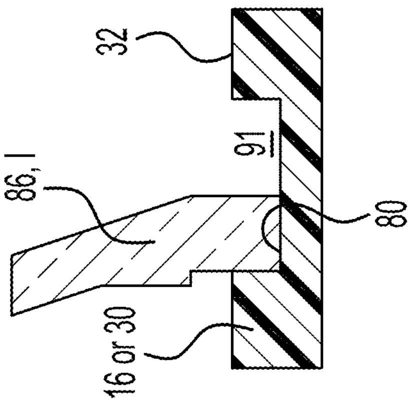
Figure 6I:
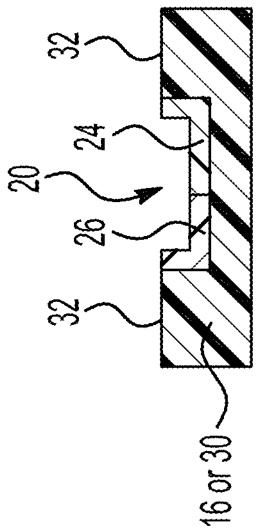
Figure 6H:
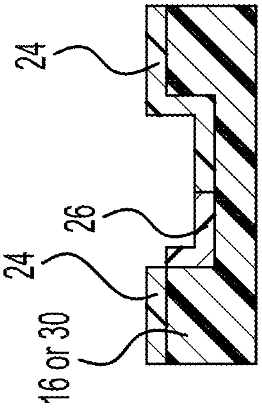
Figure 6J:
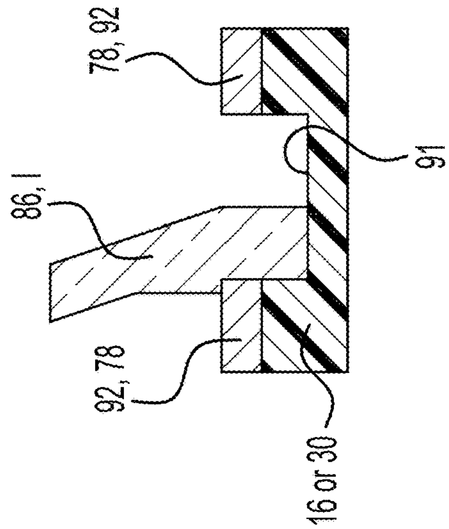
Figure 6K:
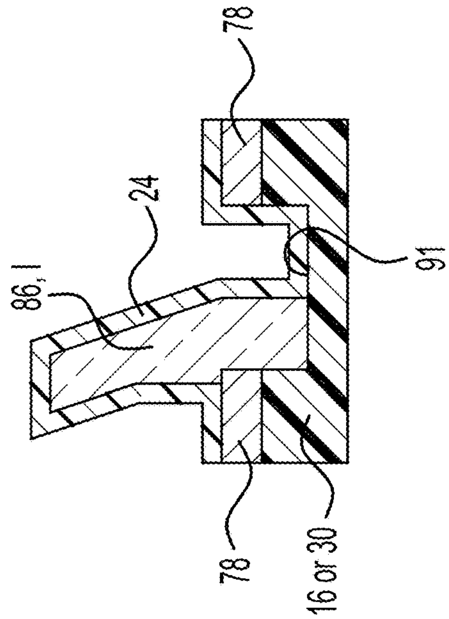
Figure 6L:
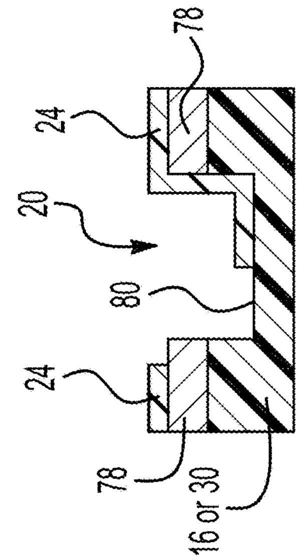
Figure 6M:
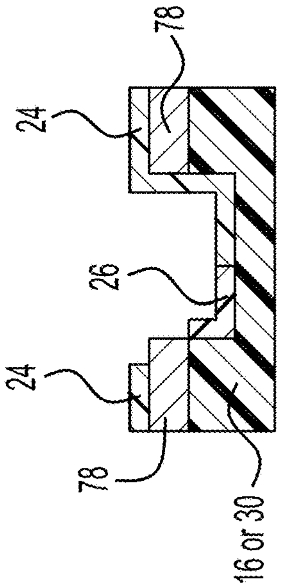
Figure 6N:
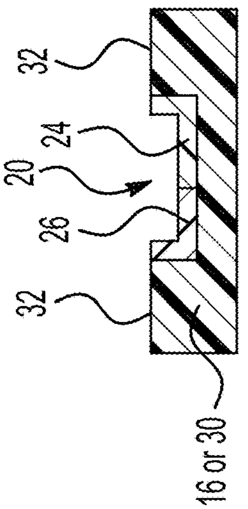

FIG. 6A through FIG. 6N illustrate two different examples of methods that utilize backside exposure. One example is shown at FIG. 6A through FIG. 6I. Another example is shown at FIG. 6A through FIG. 6D and FIG. 6J through FIG. 6N. Each of these example methods generally includes imprinting a resin layer of a multi-layer stack 68 to form a patterned resin layer 66 including a concave region 70 having a deep portion 72 and a shallow portion 74 defined by a step portion 76, wherein the multi-layer stack 68 includes the resin layer (shown as patterned resin layer 66) positioned over a sacrificial layer 78 positioned over a transparent base support (e.g., substrate 16 or 18) (FIG. 6A); etching the patterned resin layer 66, thereby extending the deep portion 72 into the transparent base support (specifically into substrate 16 or layer 30 of substrate 18) to create a depression portion 80, removing the step portion 76 to expose a portion 82 of the sacrificial layer 78, and forming interstitial regions 84 of the patterned resin layer 66 that surround the depression portion 80 and the portion 82 of the sacrificial layer 78 (FIG. 6B); depositing a negative photoresist 86 over the interstitial regions 84 of the patterned resin layer 66, the depression portion 80, and the portion 82 of the sacrificial layer 78 (FIG. 6C); exposing the negative photoresist 86 to ultraviolet light i) through the transparent base support (e.g., substrate 16 or 18) and ii) at an angle that is non-perpendicular, non-parallel, and offset from a surface plane 88 of the interstitial regions 84 such that an insoluble negative photoresist 86, I is generated in the depression portion 80 and over at least a portion of the interstitial region 84 that is adjacent to the deep portion 72, and a soluble negative photoresist 86, S is generated over the portion 82 of the sacrificial layer 78 (FIG. 6C); utilizing the insoluble negative photoresist 86, I to create a second depression portion 91 adjacent to the depression portion 80 and to define a first functionalized layer 24 over the second depression portion 91 (FIG. 6E and FIG. 6F or FIG. 6J and FIG. 6K); removing the insoluble negative photoresist 86, I, thereby exposing the depression portion 80 (FIG. 6G or FIG. 6L); and selectively applying a second functionalized layer 26 over the depression portion 80 (FIG. 6H or FIG. 6M).

In these example methods, the “transparent base support” refers to either the substrate 16 or 18, which is made up of material(s) that is/are transparent to the ultraviolet light utilized in the backside exposure. In these examples, the single layer substrate 16 is any of the transparent materials described herein, or the base support 28 and the other layer 30 of the multi-layer substrate 18 are any of the transparent materials described herein.

Each of these methods in the FIG. 6 series begins with a multi-layer stack 86 of materials, which includes the resin layer (the precursor to the patterned resin layer 66 shown in FIG. 6A) positioned over the sacrificial layer 78 positioned over the transparent substrate, which, as shown in FIG. 6A, can be either the single layer substrate 16 or the multi-layer substrate 18.

To generate the multi-layer stack 68, the sacrificial layer 78 is deposited over the substrate 16 or layer 30. Examples of suitable materials for the sacrificial layer 78 include metals, such as aluminum, copper, gold, etc. In some examples, the metal may be at least substantially pure (<99% pure). In other examples, molecules or compounds of the listed elements may be used as long as the sacrificial layer 78 is opaque (non-transparent or having transmittance less than 0.25) to the light energy used for negative photoresist 86 development. For example, oxides of any of the listed metals (e.g., aluminum oxide) may be used, alone or in combination with the listed metal. These materials may be deposited using any suitable technique disclosed herein.

The resin layer is then deposited over the sacrificial layer 78. The resin layer may be any of the example transparent resins set forth herein, and may be deposited using any suitable technique disclosed herein. For some deposition techniques, the resin may be mixed in a liquid carrier, such as propylene glycol monomethyl ether acetate (PGMEA), toluene, dimethyl sulfoxide (DMSO), tetrahydrofuran (THF), etc. In one example, the resin layer is a lift-off resist. Examples of suitable lift-off resists include those that are commercially available from Kayaku Advanced Materials, Inc. (formerly MicroChem), which are based on a polymethylglutarimide platform. The lift-off resist may be spun on or otherwise deposited, cured, and subsequently removed at a desirable time in the process.

In FIG. 6A, the resin layer has been imprinted to form the patterned resin layer 66, which includes the concave region 70. The concave region 70 includes the deep portion 72 and the shallow portion 74 defined by the step portion 76. In the concave region 70, it is to be understood that the depth of the deep portion 72 and the depth of the shallow portion 74 are each within the depression depth ranges provided herein, with the caveat that the depth of the deep portion 72 is greater than the depth of the shallow portion 74.

The resin layer may be imprinted using nanoimprint lithography as described herein.

The multi-layer stack 68 is then selectively etched to create a first depression portion 80 in the transparent base support (e.g., in substrate 16 or in layer 30 of substrate 18) at the deep portion 72, and to expose a portion 82 of the sacrificial layer 78 at the shallow portion 74. This involves a series of etching processes, as one process is used for the patterned resin layer 66 and transparent base support 16, 18 and another process is used for the sacrificial layer 78. The etched stack is shown in FIG. 6B.

The initial etching of the patterned resin layer 66 (as it is depicted in FIG. 6A) may involve a dry etching process performed with a mixture of 90% $CF_4$ and 10% $O_2$ plasma. As the portion of the patterned resin layer 66 is thinner at the deep portion 72, the portion 78' of the sacrificial layer 78 at the deep portion 72 will be exposed before the rest of the patterned resin layer 66 is removed. As such, portion 78' of the sacrificial layer 78 acts as an etch stop, and some of the patterned resin layer 66 remains over the rest of the sacrificial layer 78 after this etching process ceases. In some instances, this etching process can expose a portion 82' of the sacrificial layer 78 that is adjacent to the deep portion 72. With some processing techniques, this exposed portion 82' can lead to the padlock like conformation.

The portion 78' of the sacrificial layer 78 may then be etched, e.g., using a chlorine-based plasma (e.g., $BCl_3+Cl_2$). The patterned resin layer 66 remains intact during this etching process, and the surface of the transparent base support 16 or 30 (underlying the deep portion 72) acts as an etch stop.

With the surface of the transparent base support 16 or 30 exposed at the deep portion 72, both the remaining patterned resin layer 66 and the exposed portion of the transparent base support 16 or 30 may be etched simultaneously. The simultaneous etching of the remaining patterned resin layer 66 and the transparent base support 16 or 30 may involve a dry etching process performed with a mixture of 90% $CF_4$ and 10% $O_2$ plasma. As the portion of the patterned resin layer 66 that underlies the shallow portion 74 is the thinnest of the remaining patterned resin layer 66, the portion 82 of the sacrificial layer 78 underlying the shallow portion 74 will be exposed before the rest of the patterned resin layer 66 is removed. The thickness of the transparent base support 16 or 30 that is removed during this process is equivalent to the thickness of the patterned resin layer 66 that is removed from beneath the shallow portion 74. This series of etching techniques forms the depression portion 80.

In FIG. 6C, the negative photoresist 86 is applied over the patterned and etched multi-layer stack 68. Examples of suitable negative photoresists include the SU-8 Series and the KMPR® Series (both of which are available from Kayaku Advanced Materials, Inc.), the UVN™ Series (available from DuPont), or the NR® series photoresist (available from Futurrex). Any suitable deposition technique may be used to apply the negative photoresist 86.

The negative photoresist 86 is exposed to certain wavelengths of light to form an insoluble negative photoresist 86, I. In this example, it is desirable for the insoluble negative photoresist 86, I to remain in the depression portion 80 and over a sidewall 90 of the patterned resin layer 66 that defines the deep portion 72 of the concave region 70. The formation of the insoluble negative photoresist 86, I along the sidewall 90 of the patterned resin layer 66 covers the previously mentioned exposed portion 82' of the sacrificial layer 78 that can otherwise lead to the padlock like conformation.

In this example, it is also desirable for the negative photoresist 86 to be patterned so that it is removed from the portion 82 of the sacrificial layer 78 at the shallow portion 74 and from the interstitial regions 84 directly adjacent to and surrounding the shallow portion 74.

To obtain the desired soluble and insoluble portions S, I of the negative photoresist 86, the light may be directed through the backside of the transparent base support 16 or 30 at an angle that is non-perpendicular to, non-parallel to, and offset from a surface plane 88 of the interstitial regions 84. The angle of the UV light exposure in this example is slanted at an angle that is greater than 20° and less than 70° or greater than 110° and less than 160° relative to the surface plane 88. In another example, the angle of the UV light exposure is slanted at an angle that is greater than 35° and less than 55° or greater than 125° and less than 145° relative to the surface plane 88. In the example shown in FIG. 6C, the UV light is directed at an angle of about 135° with respect to the planar surface 88.

Figure 8:
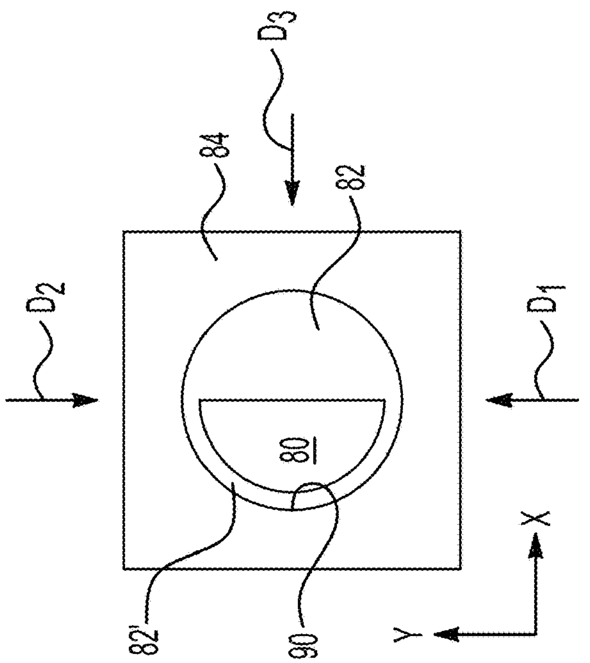
FIG. 8 is a top view of the depression of FIG. 6C.

The angled UV light exposure may be achieved by positioning the light source (e.g., a UV light emitting diode or UV lamp) at the desired angle with respect to the substrate 16 or layer 30, or by positioning the substrate 16 or layer 30 at the desired angle with respect to the light source. In one example, while the ultraviolet light is positioned at the angle, the method involves rotating the ultraviolet light to expose different portions of the negative photoresist 86 in the deep portion 72 to the ultraviolet light without exposing the negative photoresist 86 that overlies the portion 82 of the sacrificial layer 78 to the ultraviolet light. In one example, the angled UV light is rotated in in three-directions, e.g., as shown in FIG. 8. FIG. 8 depicts a top view of the etched multi-layer stack 68 without the negative photoresist 86. As depicted, the ultraviolet light may be directed in each direction $D_1$, $D_2$ along the Y axis and in one direction Ds along the X axis that points toward the sidewall 90 of the patterned resin layer 66.

In this example, the angled UV light is directed through the backside of the transparent base support 16 or 30. The sacrificial layer 78 blocks at least 75% of light that is transmitted through the transparent base support 16, 18, thus at least substantially preventing angled light that encounters the sacrificial layer 78 from reaching the negative photoresist 86. The angled light is able to pass through the negative photoresist 86 that is in the depression portion 80 because the sacrificial layer 78 is not present, and thus is not blocking the light.

Any of the negative photoresist 86 that is exposed to the angled light becomes insoluble 86, I. The shape of the resulting insoluble negative photoresist 86, I will depend, in part, upon the angle at which the UV light is directed through the backside of the transparent base support 16, 18.

In contrast, any of the negative photoresist 86 that is not exposed to the angled light remains soluble 86, S. The soluble negative photoresist 86, S can be removed with the developer. Examples of suitable developers for the negative photoresist 86, S include aqueous-alkaline solutions, such as diluted sodium hydroxide, diluted potassium hydroxide, or an aqueous solution of the metal ion free organic TMAH (tetramethylammoniumhydroxide).

The insoluble negative photoresist 86, I that remains after the soluble negative photoresist 86, S is removed is shown in FIG. 6D. As depicted, the insoluble negative photoresist 86, I covers the depression portion 80 and the sidewall 90 of the patterned resin layer 66 that defines the deep portion 72 of the concave region 70. By covering the sidewall 90 of the patterned resin layer 66 that defines the deep portion 72 of the concave region 70, any exposed portion 82' of the sacrificial layer 78 that is adjacent to the deep portion 72 is covered. This prevents the first functionalized layer 24 from being deposited over the exposed portion 82' and forming the padlock like conformation.

One example of the methods shown in FIG. 6A through FIG. 6N continues at FIG. 6E.

In this example, utilizing the insoluble negative photoresist 86, I may involve: dry etching i) portions of the patterned resin layer 66 underlying the interstitial regions 84, ii) the sacrificial layer 78 to expose the transparent base support 16, 18, and iii) a portion of the transparent base support 16, 18 adjacent to the depression portion 80 to form the second depression portion 91 (FIG. 6E); applying the first functionalized layer 24 over the insoluble negative photoresist 86, I, the second depression portion 91, and the interstitial regions 32 (FIG. 6F); and removing the insoluble negative photoresist 86, I and the first functionalized layer 24 thereon to expose the depression portion 80 (FIG. 6G). The method may further include depositing the second functionalized layer 26 (FIG. 6H) and removing the first functionalized layer 24 from the interstitial regions 32 after the second functionalized layer 26 is applied (FIG. 6I).

Referring now to FIG. 6E, the multi-layer stack 68 is selectively etched to form the second depression portion 91 in the transparent base support 16, 18. This involves a series of etching processes, as one process is used for the patterned resin layer 66 and transparent base support 16, 18, and another process is used for the sacrificial layer 78.

The initial etching of the portion 82 of the sacrificial layer 48 may be performed, e.g., using a chlorine-based plasma (e.g., BCl3+Cl2). The patterned resin layer 66 remains intact during this etching process, and the surface of the transparent base support 16, 18 (underlying the shallow portion 74) acts as an etch stop.

With the surface of the transparent base support 16, 18 exposed at the shallow portion 74, both the remaining patterned resin layer 66 and the exposed portion of the transparent base support 16, 18 may be etched simultaneously. The simultaneous etching of the remaining patterned resin layer 66 and the transparent base support 16, 18 may involve a dry etching process performed with a mixture of 90% $CF_4$ and 10% $O_2$ plasma. The portions 92 of the sacrificial layer 78 underlying the remaining patterned resin layer 66 (see FIG. 6D) will act as an etch stop. Thus, the thickness of the transparent base support 16, 18 that is removed during this process is equivalent to the thickness of the patterned resin layer 66 that is removed over the portions 92 of the sacrificial layer 78.

The portions 92 of the sacrificial layer 78 may then be etched, e.g., using a chlorine-based plasma (e.g., BCl3+Cl2) or a wet etch with potassium hydroxide (KOH), tetramethylammoniumhydroxide (TMHA), nitric acid, acetic acid, or phosphoric acid. The transparent base support 16, 18 acts as an etch stop and remains intact during this etching process. This series of etching techniques forms the second depression portion 91, as shown in FIG. 6E. Together, the depression portions 80, 91 form the depression 20.

In this example, the removal of the patterned resin layer 66 and the remaining sacrificial layer 78 underlying the patterned resin layer 66 forms new interstitial regions 32 at portions of the transparent base support 16, 18 that surround the depression portions 80, 91.

In FIG. 6F, the first functionalized layer 24 is then applied over the second depression portion 91 in the transparent base support 16, 18 using any suitable deposition technique. In this example, the first functionalized layer 24 is also deposited over the insoluble negative photoresist 86, I and the interstitial regions 32. Any example of the first functionalized layer 24 disclosed herein may be used, and may be deposited using any suitable technique.

At the outset of the method shown in FIG. 6A to FIG. 6I, the transparent base support 16, 18 may be activated using silanization or plasma ashing to generate surface groups that can react with the functionalized layer 24. As such, the functionalized layer 24 covalently attaches to the second depression portion 91 of the transparent base support 16, 18.

Removal of the insoluble negative photoresist 86, I may then be performed to re-expose the depression portion 80 in the transparent base support 16, 18. While the insoluble negative photoresist 86, I is not soluble in the developer, it may be soluble (at least 99% soluble) in a remover. Suitable removers include dimethylsulfoxide (DMSO) with sonication, or acetone, or an NMP (N-methyl-2-pyrrolidone) based stripper. As shown in FIG. 6G, this process removes the insoluble negative photoresist 86, I and the functionalized layer 24 that overlies the insoluble negative photoresist 86, I.

As shown in FIG. 6H, the second functionalized layer 26 may then be applied over depression portion 80 in the transparent base support 16, 18. The second functionalized layer 26 may be applied using any suitable deposition technique. In this example, deposition of the second functionalized layer 26 is performed under high ionic strength (e.g., in the presence of 10×PBS, NaCl, KCl, etc.) so that the second functionalized layer 26 does not deposit on or adhere to the first functionalized layer 24. As such, the second functionalized layer 26 does not contaminate the first functionalized layer 24.

In FIG. 6I, the functionalized layer 24 that is positioned over the interstitial regions 32 is removed, e.g., using a polishing process. The polishing process may be performed as described herein in reference to FIG. 4F.

While a single set of the functionalized layers 24, 26 is shown in FIG. 6I, it is to be understood that the method described in reference to FIG. 6A through FIG. 6I may be performed to generate an array of depressions 20 (having functionalized layers 24, 26 therein) separated by interstitial regions 32 across the surface of the transparent base support 16, 18.

While not shown, this method also includes attaching respective primer sets 50, 52 to the functionalized layers 24, 26. In some examples, the primers 34, 36 or 34', 36' (not shown in FIG. 6A through FIG. 6I) may be pre-grafted to the functionalized layer 24. Similarly, the primers 38, 40 or 38', 40' (not shown in FIG. 6A through FIG. 6I) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 6F). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 6H or FIG. 6I), as long as i) the second functionalized layer 26 has different functional groups (than the first functionalized layer 24) for attaching the primers 38, 40 or 38', 40' or ii) any unreacted functional groups of the first functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Referring back to FIG. 6D, where the insoluble negative photoresist 86, I has been developed and the portion 82 of the sacrificial layer 78 has been exposed, another example of the method proceeds from FIG. 6D to FIG. 6J.

In this example, utilizing the insoluble negative photoresist 86, I may involve: dry etching i) the portion 82 of the sacrificial layer 78, and ii) a portion of the transparent base support 16, 18 adjacent to the depression portion 80 and underlying the portion 82 of the sacrificial layer 78 to form the second depression portion 91 (FIG. 6J); applying the first functionalized layer 24 over the insoluble negative photoresist 86, I, the second depression portion 91, and remaining portions of the sacrificial layer 78 (FIG. 6K); and removing the insoluble negative photoresist 86, I and the first functionalized layer 24 thereon to expose the depression portion 80 (FIG. 6L). After the second functionalized layer 26 is applied, the method may further comprise lifting off remaining portions of the sacrificial layer 78, including portions of the first functionalized layer 24 thereon (FIG. 6N).

This example method involves a series of etching processes moving from FIG. 6D to FIG. 6J. One etching process is used for the patterned resin layer 66 and the transparent base support 16, 18, and the other etching process is used for the sacrificial layer 78.

The portion 82 of the sacrificial layer 78 is etched first, e.g., using a chlorine-based plasma (e.g., $BCl_3+Cl_2$). The patterned resin layer 66 remains intact during this etching process, and the surface of the transparent base support 16, 18 (underlying the shallow portion 74) acts as an etch stop.

With the surface of the transparent base support 16, 18 exposed at the shallow portion 74, both the remaining patterned resin layer 66 and the exposed portion of the transparent base support 16, 18 may be etched simultaneously. The simultaneous etching of the remaining patterned resin layer 66 and the transparent base support 16, 18 may involve a dry etching process performed with a mixture of 90% $CF_4$ and 10% $O_2$ plasma. The portions 92 of the sacrificial layer 78 underlying the remaining patterned resin layer 66 will act as an etch stop. Thus, the thickness of the transparent base support 16, 18 that is removed during this process is equivalent to the thickness of the patterned resin layer 66 that is removed from the portions 92 of the sacrificial layer 78. This series of etching steps form the second depression portion 91, as shown in FIG. 6J. Together, the depression portions 80, 91 form the depression 20.

In FIG. 6K, the first functionalized layer 24 is then applied over the second depression portion 91 using any suitable deposition technique. In this example, the first functionalized layer 24 is also deposited over the remaining sacrificial layer 78 and over the insoluble negative photoresist 86, I.

At the outset of the method shown in FIG. 6A through FIG. 6D and FIG. 6J through FIG. 6N, the transparent base support 16, 18 may be activated using silanization or plasma ashing to generate surface groups that can react with the first functionalized layer 24. As such, the first functionalized layer 24 covalently attaches to the second depression portion 91 in the transparent base support 16, 18.

Removal of the insoluble negative photoresist 86, I may then be performed to re-expose the first depression portion 80 in the transparent base support 16, 18. Any suitable remover for the insoluble negative photoresist 86, I may be used, such as dimethylsulfoxide (DMSO), or acetone, or an NMP (N-methyl-2-pyrrolidone) based stripper. As shown in FIG. 6L, this process removes the insoluble negative photoresist 86, I and the functionalized layer 24 that overlies the insoluble negative photoresist 86, I.

As shown in FIG. 6M, the second functionalized layer 26 may then be applied over the depression portion 80. Any example of the second functionalized layer 26 may be used, and the second functionalized layer 26 may be applied using any suitable deposition technique. Because the first functionalized layer 24 is exposed, deposition of the second functionalized layer 26 is performed under high ionic strength (e.g., in the presence of 10×PBS, NaCl, KCl, etc.) so that the second functionalized layer 26 does not deposit on or adhere to the first functionalized layer 24. As such, the second functionalized layer 26 does not contaminate the first functionalized layer 24.

Lift-off of the remaining sacrificial layer 78 may then be performed. As shown in FIG. 6N, the lift-off process removes i) at least 99% of the sacrificial layer 78 and ii) and the functionalized layer 24 that overlies the sacrificial layer 78. The lift-off process may involve an organic solvent that is capable of dissolving or otherwise lifting off the sacrificial layer 78. As examples, an aluminum sacrificial layer 78 can be removed in acidic (e.g., nitric acid based) or basic (e.g., KOH based) conditions, a copper sacrificial layer 78 can be removed using $FeCl_3$, and a copper, gold or silver sacrificial layer 78 can be removed in an iodine and iodide solution. The lift-off process exposes the interstitial regions 32 and does not deleteriously affect the first and second functionalized layers 24, 26 in the depression 20.

While a single set of the functionalized layers 24, 26 is shown in FIG. 6N, it is to be understood that the method described in reference to FIG. 6A through FIG. 6D and FIG. 6J through FIG. 6N may be performed to generate an array of functionalized layers 24, 26, separated by interstitial regions 32 across the surface of the transparent base support 16, 18.

While not shown, the methods described in at FIG. 6A through FIG. 6D and FIG. 6J through FIG. 6N also includes attaching respective primer sets 50, 52 to the functionalized layers, 24, 26. In some examples, the primers 34, 36 or 34', 36' (not shown in FIG. 6A through FIG. 6D and FIG. 6J through FIG. 6N) may be pre-grafted to the first functionalized layer 24. Similarly, the primers 38, 40 or 38' or 40' (not shown in FIG. 6A through FIG. 6D and FIG. 6J through FIG. 6N) may be pre-grafted to the second functionalized layer 26. In these examples, additional primer grafting is not performed.

In other examples, the primers 34, 36 or 34', 36' are not pre-grafted to the first functionalized layer 24. In these examples, the primers 34, 36 or 34', 36' may be grafted after the functionalized layer 24 is applied (e.g., at FIG. 6K). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 6M or FIG. 6N), as long as i) the second functionalized layer 26 has different functional groups (than the first functionalized layer 24) for attaching the primers 38, 40 or 38', 40' or ii) unreacted functional groups of the first functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Figure 7C:
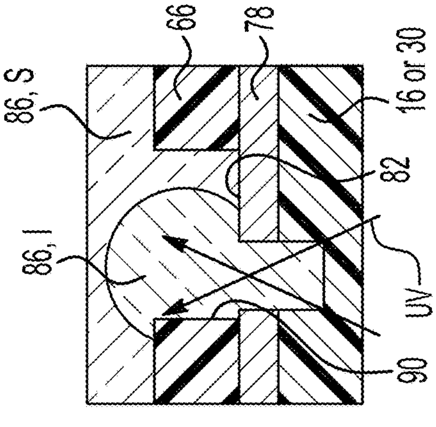
Figure 7D:
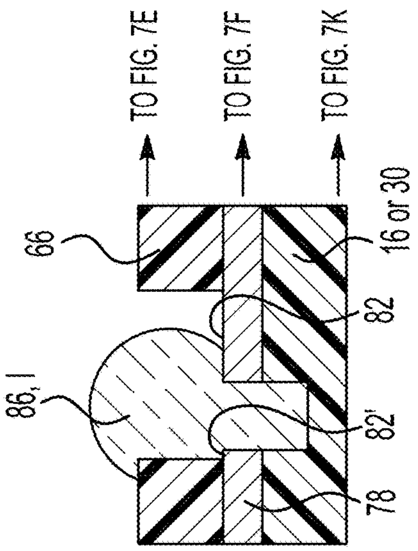
Figure 7E:
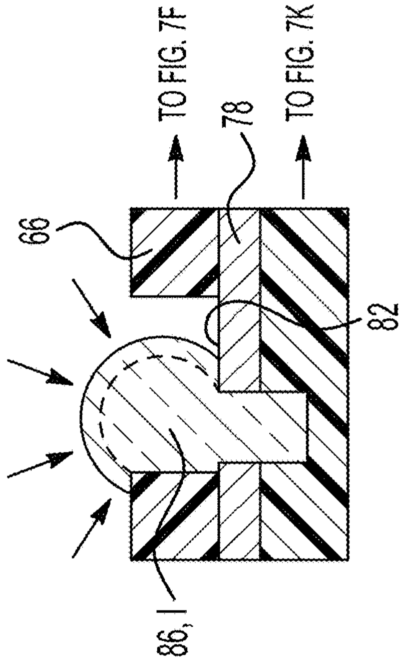
Figure 7F:
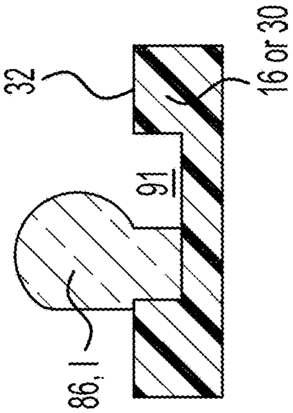
Figure 7G:
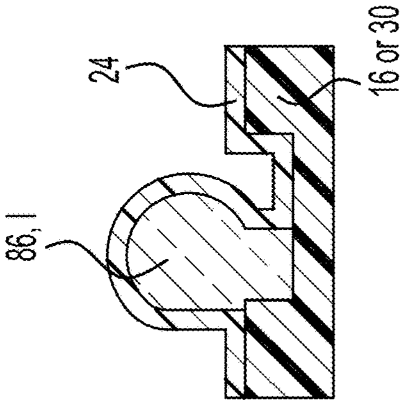
Figure 7H:
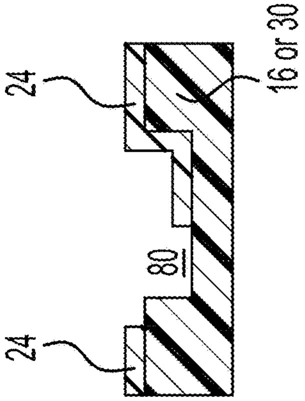
Figure 7I:
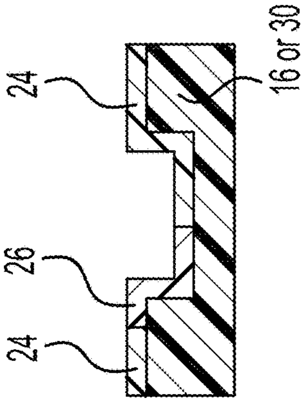
Figure 7J:
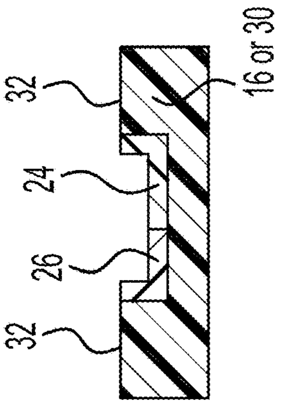
Figure 7K:
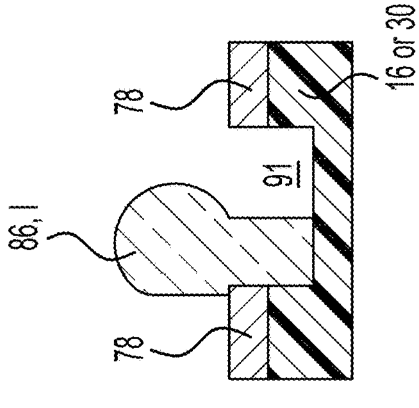
FIG. 7K depicts the insoluble negative photoresist in a portion of the depression after the multi-layer stack is exposed to additional etching to form a second depression portion.
Figure 7L:
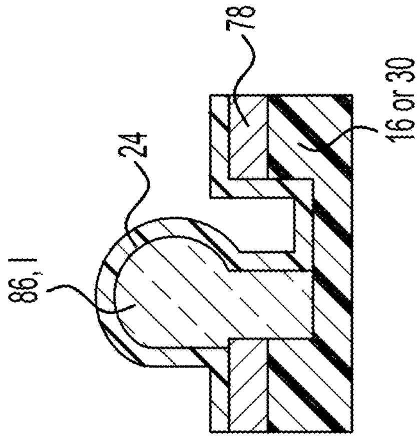
FIG. 7L depicts a first functionalized layer applied to the second depression portion.
Figure 7M:
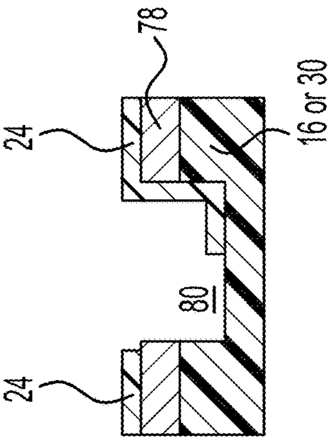
FIG. 7M depicts the exposure of the depression portion after the insoluble negative photoresist is removed.
Figure 7N:
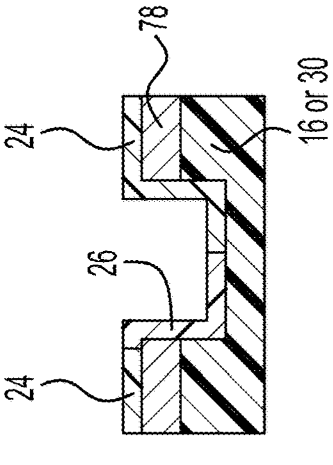
FIG. 7N depicts a second functionalized layer applied to the depression portion.
Figure 7O:
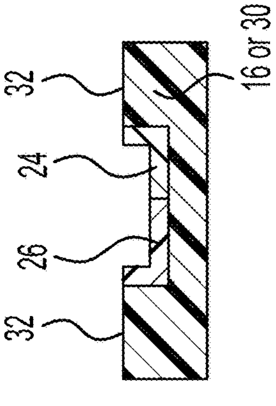
FIG. 7O depicts the substrate with the functionalized layers in the depression and removed from the interstitial regions.

FIG. 7A through FIG. 7O also illustrate two different examples of methods that utilize backside exposure. One example is shown at FIG. 7A through FIG. 7J. Another example is shown at FIG. 7A through FIG. 7E and FIG. 7K through FIG. 7O. In each of these examples, the isotropic etching shown in FIG. 7E is optional. Each of these example methods generally includes imprinting a resin layer of a multi-layer stack 68 to form a patterned resin layer 66 including a concave region 70 having a deep portion 72 and a shallow portion 74 defined by a step portion 76, wherein the multi-layer stack 68 includes the resin layer (shown as patterned resin layer 66) positioned over a sacrificial layer 78 positioned over a transparent base support (e.g., substrate 16 or 18) (FIG. 7A); etching the patterned resin layer 66, thereby extending the deep portion 72 into the transparent base support (specifically in substrate 16 or in layer 30 of substrate 18) to create a depression portion 80, removing the step portion 76 to expose a portion 82 of the sacrificial layer 78, and forming interstitial regions 84 of the patterned resin layer 66 that surround the depression portion 80 and the portion 82 of the sacrificial layer 78 (FIG. 7B); depositing a negative photoresist 86 over the interstitial regions 84 of the patterned resin layer 66, the depression portion 80, and the portion 82 of the sacrificial layer 78 (FIG. 7C); exposing the negative photoresist 86 to diffused ultraviolet light through the transparent base support such that an insoluble negative photoresist 86, I is generated over the depression portion 80 and in contact with at least a portion of a sidewall 90 that defines the deep portion 72, and a soluble negative photoresist 86, S is generated over the portion 82 of the sacrificial layer 78 (FIG. 7C); utilizing the insoluble negative photoresist 86, I to create a second depression portion 91 adjacent to the depression portion 80 and to define a first functionalized layer 24 over the second depression portion 91 (FIG. 7F and FIG. 7G or FIG. 7K and FIG. 7L); removing the insoluble negative photoresist 86, I, thereby exposing the depression portion 80 (FIG. 7H or FIG. 7M; and selectively applying a second functionalized layer 26 over the depression portion 80 (FIG. 7I or FIG. 7N).

Similar to FIG. 6A through FIG. 6N, in these example methods, the "transparent base support" is either the substrate 16 or 18, which is made up of material(s) that is/are transparent to the ultraviolet light utilized in the backside exposure. As such, the single layer substrate 16 is any of the transparent materials described herein, or the base support 28 and the other layer 30 are any of the transparent materials described herein.

Each of these methods in the FIG. 7 series begins with a multi-layer stack 86 of materials, which includes the resin layer (the precursor to the patterned resin layer 66 shown in FIG. 7A) positioned over the sacrificial layer 78 positioned over the transparent substrate, which, as shown in FIG. 7A, can be either the single layer substrate 16 or the multi-layer substrate 18. The multi-layer stack 68 and the concave region 70 may be formed as described in reference to FIG. 6A.

The multi-layer stack 68 is then selectively etched to create a first depression portion 80 in the transparent base support (e.g., in substrate 16 or in layer 30 of substrate 18) at the deep portion 72, and to expose a portion 82 of the sacrificial layer 78 at the shallow portion 74. This involves the series of etching processes as described in reference to FIG. 6B.

In these example methods, as shown in FIG. 7C, the negative photoresist 86 is applied over the patterned and etched multi-layer stack 68. The negative photoresist 86 may be any of the examples set forth herein and may be deposited using any suitable technique set forth herein.

In this example method, the negative photoresist 86 is exposed to diffused ultraviolet light through the backside of the transparent base support 16 or 30. A diffuser plate may be positioned in the UV pathway to the substrate 16, 18. The diffused UV light encounters the negative photoresist 86 at the depression portion 80 where the sacrificial layer 78 is not present. As such, the insoluble negative photoresist 86, I is formed in the depression portion 80 and over the depression portion 80 because the sacrificial layer 78 is not present, and thus is not blocking the light from diffusing through the negative photoresist 86 at these portions. The randomized UV light used in diffused ultraviolet light lithography is capable of forming photoresist patterns with a circular or elliptical cross-section (as shown in FIG. 7C). The circular or elliptical cross-section enables some of the insoluble negative photoresist 86, I to contact the sidewall 90 of the patterned resin layer 66 that defines the deep portion 72 of the concave region 70. The formation of the insoluble negative photoresist 86, I along the sidewall 90 of the patterned resin layer 66 covers the exposed portion 82' of the sacrificial layer 78 that can otherwise lead to the padlock like conformation.

In this example, the sacrificial layer 78 blocks at least 75% of the diffused light that is transmitted through the transparent base support 16, 18 and that encounters the sacrificial layer 78. As such, most of the negative photoresist 86 that overlies the sacrificial layer 78 remains soluble. It is to be understood however, that the circular or elliptical cross-section of the insoluble negative photoresist 86, I may extend slightly over the sacrificial layer 78 without fully covering the portion 82 of the sacrificial layer 78.

The circular or elliptical cross-section can be controlled by adjusting process parameters, such as the type of diffuser, the UV exposure dose, the thickness of the negative photoresist 86, and/or the opening width of the depression portion 80. In an example, the negative photoresist is NR9-250P and the UV dose ranges from about 55 $mJ/cm^2$ (which form a taller and narrower elliptical cross-section) to about 77 $J/cm^2$ (which form a shorter and wider elliptical cross-section with rounder edges).

Any of the negative photoresist 86 that is exposed to the diffused light becomes insoluble 86, I. In contrast, any of the negative photoresist 86 that is not exposed to the diffused light remains soluble 86, S. The soluble negative photoresist 86, S can be removed with any of the negative photoresist developers set forth herein.

The remaining insoluble negative photoresist 86, I after the soluble negative photoresist 86, S is removed is shown in FIG. 7D. As depicted, the insoluble negative photoresist 86, I covers the depression portion 80 and the sidewall 90 of the patterned resin layer 66 that defines the deep portion 72 of the concave region 70. By covering the sidewall 90 of the patterned resin layer 66 that defines the deep portion 72 of the concave region 70, any exposed portion 82' of the sacrificial layer 78 that is adjacent to the deep portion 72 is covered. This prevents the first functionalized layer 24 from being deposited over the exposed portion 82' and forming the padlock like conformation.

As mentioned herein and as shown in in FIG. 7D, some of the insoluble negative photoresist 86, I may extend slightly over the sacrificial layer 78 without fully covering the portion 82 of the sacrificial layer 78. Depending upon the extent to which the portion of the insoluble negative photoresist 86, I extends over the portion 82, downstream processing (e.g., removal of the sacrificial layer 78) could be inhibited. As such, in some examples of the method, the insoluble negative photoresist 86, I is isotropically etched. This is shown in FIG. 7E. In this example, an isotropic dry etch may be performed to remove at least a portion of the insoluble negative photoresist 86, I that immediately contacts and/or overhangs the portion 82 of the sacrificial layer 78. The insoluble negative photoresist 86, I in contact with the sidewall 90 of the patterned resin layer 66 remains intact. The dry isotropic etch may be performed with an $O_2$ plasma. The dry isotropic etch may be stopped once a desirable portion of the insoluble negative photoresist 86, I is removed from the portion 82, but so that the bulk of the insoluble negative photoresist 86, I remains in the depression portion 80.

Whether or not the isotropic etching is performed, one example of the methods shown in FIG. 7A through FIG. 7O continues at FIG. 7F.

In this example, utilizing the insoluble negative photoresist 86, I may involve: dry etching i) portions of the patterned resin layer 66 underlying the interstitial regions 84, ii) the sacrificial layer 78 to expose the transparent base support 16, 18, and iii) a portion of the transparent base support 16, 18 adjacent to the depression portion 80 to form the second depression portion 91 (FIG. 7F); applying the first functionalized layer 24 over the insoluble negative photoresist 86, I, the second depression portion 91, and the interstitial regions 32 (FIG. 7G); and removing the insoluble negative photoresist 86, I and the first functionalized layer 24 thereon to expose the depression portion 80 (FIG. 7H). The method may further include depositing the second functionalized layer 26 (FIG. 7I) and removing the functionalized layer(s) 24, 26 from the interstitial regions 32 after the second functionalized layer 26 is applied (FIG. 7J).

The multi-layer stack 68 is selectively etched to form the second depression portion 91 in the transparent base support 16, 18, as shown in FIG. 7F. This involves a series of etching processes as described in reference to FIG. 6E. The removal of the patterned resin layer 66 and the remaining sacrificial layer 78 underlying the patterned resin layer 66 forms new interstitial regions 32 at portions of the transparent base support 16, 18 that surround the depression portions 80, 91.

In FIG. 7G, the first functionalized layer 24 is then applied over the second depression portion 91 using any suitable deposition technique. In this example, the first functionalized layer 24 is also deposited over the insoluble negative photoresist 86, I and the interstitial regions 32. Any example of the first functionalized layer 24 disclosed herein may be used, and may be deposited using any suitable technique.

At the outset of the method shown in FIG. 7A to FIG. 7J, the transparent base support 16, 18 may be activated using silanization or plasma ashing to generate surface groups that can react with the first functionalized layer 24. As such, the first functionalized layer 24 covalently attaches to the second depression portion 91 of the transparent base support 16, 18.

Removal of the insoluble negative photoresist 86, I may then be performed to re-expose the depression portion 80 in the transparent base support 16, 18. Any suitable remover may be used to remove the insoluble negative photoresist 86, I and the first functionalized layer 24 that overlies the insoluble negative photoresist 86, I. The re-exposed depression portion 80 is shown in FIG. 7H.

As shown in FIG. 7I, the second functionalized layer 26 may then be applied over depression portion 80 in the transparent base support 16, 18. The second functionalized layer 26 may be applied using any suitable deposition technique. In this example, deposition of the second functionalized layer 26 is performed under high ionic strength (e.g., in the presence of 10×PBS, NaCl, KCl, etc.) so that the second functionalized layer 26 does not deposit on or adhere to the first functionalized layer 24. As such, the second functionalized layer 26 does not contaminate the first functionalized layer 24. As shown in FIG. 7I, the second functionalized layer 26 may be deposited on a portion of the interstitial region 32 where the insoluble negative photoresist 86, I had been.

In FIG. 7J, the functionalized layer(s) 24, 26 that is/are positioned over the interstitial regions 32 is/are removed, e.g., using a polishing process. The polishing process may be performed as described herein in reference to FIG. 4F.

While a single set of the functionalized layers 24, 26 is shown in FIG. 7J, it is to be understood that the method described in reference to FIG. 7A through FIG. 7J may be performed to generate an array of depressions 20 (having functionalized layers 24, 26 therein) separated by interstitial regions 32 across the surface of the transparent base support 16, 18.

While not shown, this method also includes attaching respective primer sets 50, 52 to the functionalized layers 24, 26. In some examples, the primers 34, 36 or 34', 36' (not shown in FIG. 7A through FIG. 7J) may be pre-grafted to the functionalized layer 24. Similarly, the primers 38, 40 or 38', 40' (not shown in FIG. 7A through FIG. 7J) may be pre-grafted to the functionalized layer 26. In these examples, additional primer grafting is not performed.

In other examples, the primers 34, 36 or 34', 36' are not pre-grafted to the first functionalized layer 24. In these examples, the primers 34, 36 or 34', 36' may be grafted after the first functionalized layer 24 is applied (e.g., at FIG. 7G). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 7I), as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Referring back to FIG. 7D, where the insoluble negative photoresist 86, I has been developed and the portion 82 of the sacrificial layer 78 has been exposed, another example of the method proceeds from FIG. 7D to FIG. 7K or from FIG. 7D to FIG. 7E to FIG. 7K.

In this example, utilizing the insoluble negative photoresist 86, I may involve: dry etching i) the portion 82 of the sacrificial layer 78, and ii) a portion of the transparent base support 16, 18 adjacent to the depression portion 80 and underlying the portion 82 of the sacrificial layer 78 to form the second depression portion 91 (FIG. 7K); applying the first functionalized layer 24 over the insoluble negative photoresist 86, I, the second depression portion 91, and remaining portions of the sacrificial layer 78 (FIG. 7L); and removing the insoluble negative photoresist 86, I and the first functionalized layer 24 thereon to expose the depression portion 80 (FIG. 7M). After the second functionalized layer 26 is applied, the method may further comprise lifting off remaining portions of the sacrificial layer 78, including portions of the first functionalized layer 24 thereon (FIG. 7O).

This example method involves a series of etching processes moving from FIG. 7D or FIG. 7E to FIG. 7K. One etching process is used for the patterned resin layer 66 and transparent base support 16, 18, and the other etching process is used for the sacrificial layer 78. These etching processes form the second depression portion 91, and may be performed as described in reference to FIG. 6J.

In FIG. 7L, the first functionalized layer 24 is then applied over the second depression portion 91 using any suitable deposition technique. In this example, the first functionalized layer 24 is also deposited over the remaining sacrificial layer 78 and over the insoluble negative photoresist 86, I.

At the outset of the method shown in FIG. 7A through FIG. 7D or FIG. 7E and FIG. 7K through FIG. 7M, the transparent base support 16, 18 may be activated using silanization or plasma ashing to generate surface groups that can react with the functionalized layer 24. As such, the functionalized layer 24 covalently attaches to the second depression portion 91 in the transparent base support 16, 18.

Removal of the insoluble negative photoresist 86, I may then be performed to re-expose the first depression portion 80 in the transparent base support 16, 18. Any suitable remover for the insoluble negative photoresist 86, I may be used. As shown in FIG. 7M, this process removes the insoluble negative photoresist 86, I and the functionalized layer 24 that overlies the insoluble negative photoresist 86, I.

As shown in FIG. 7N, the second functionalized layer 26 may then be applied over the depression portion 80. Any example of the second functionalized layer 26 may be used, and the second functionalized layer 26 may be applied using any suitable deposition technique. Because the first functionalized layer 24 is exposed, deposition of the second functionalized layer 26 is performed under high ionic strength (e.g., in the presence of 10×PBS, NaCl, KCl, etc.) so that the second functionalized layer 26 does not deposit on or adhere to the first functionalized layer 24. As such, the second functionalized layer 26 does not contaminate the first functionalized layer 24.

Lift-off of the remaining sacrificial layer 78 may then be performed. As shown in FIG. 7O, the lift-off process removes i) at least 99% of the sacrificial layer 78 and ii) and the functionalized layers 24, 26 that overlie the sacrificial layer 78. The lift-off process may involve any of the organic solvents disclosed herein. The lift-off process exposes the interstitial regions 32 and does not deleteriously affect the first and second functionalized layers 24, 26 in the depression 20.

While a single set of the functionalized layers 24, 26 is shown in FIG. 7O, it is to be understood that the method described in reference to FIG. 7A through FIG. 7D or FIG. 7E and FIG. 7K through FIG. 7O may be performed to generate an array of functionalized layers 24, 26, separated by interstitial regions 32 across the surface of the transparent base support 16, 18.

While not shown, the methods described in at FIG. 7A through FIG. 7D or FIG. 7E and FIG. 7K through FIG. 7O also includes attaching respective primer sets 50, 52 to the functionalized layers, 24, 26. In some examples, the primers 34, 36 or 34', 36' (not shown in FIG. 7A through FIG. 7D or FIG. 7E and FIG. 7K through FIG. 7O) may be pre-grafted to the functionalized layer 24. Similarly, the primers 38, 40 or 38' or 40' (not shown in FIG. 7A through FIG. 7D or FIG. 7E and FIG. 7K through FIG. 7O) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 7L). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 7N or FIG. 7O), as long as i) the second functionalized layer 26 has different functional groups (than the first functionalized layer 24) for attaching the primers 38, 40 or 38', 40' or ii) unreacted functional groups of the first functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

To further illustrate the present disclosure, an example is given herein. It is to be understood that this example is provided for illustrative purposes and is not to be construed as limiting the scope of the present disclosure.

Non-Limiting Working Example

An example and a comparative example were performed. A multi-depth concave region was imprinted in an ultraviolet light transparent resin layer using nanoimprint lithography. A negative photoresist was applied in the depression and to surrounding interstitial regions.

Figure 9A:
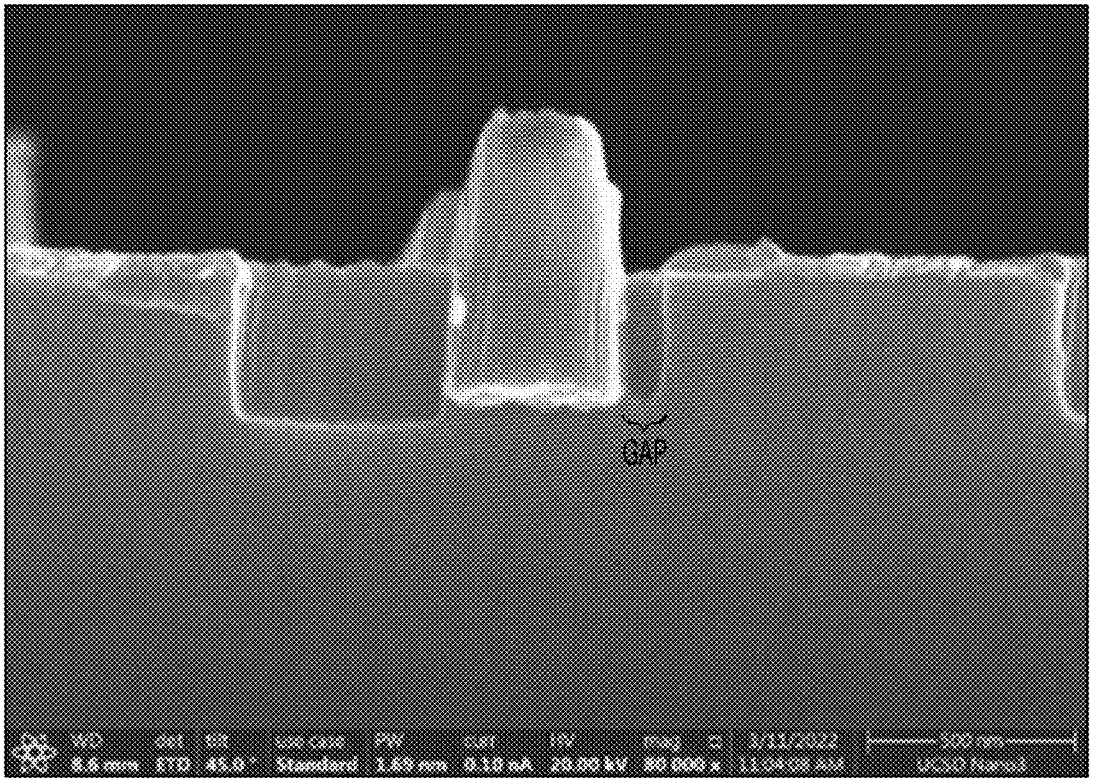
FIG. 9A is a scanning electron micrograph (SEM) image of a cross-section of a developed photoresist in a concave region of a resin layer after backside exposure where ultraviolet light was directed at a 90° angle with respect to a surface plane of the resin layer.

For the comparative example, ultraviolet light (55 mJ/$cm^2$) was directed through the ultraviolet light transparent resin layer (i.e., backside exposure) toward the shallow portion of the concave region at a 90° angle with respect to the surface plane of the resin layer at the shallow region. The resin layer overlying the interstitial regions and in the deep portion of the concave region were not exposed to the ultraviolet light. A scanning electron micrograph of a cross-section of the developed photoresist in the concave region is shown in FIG. 9A. As depicted, a gap was formed between the photoresist and the sidewall of the concave region adjacent the shallow portion.

Figure 9B:
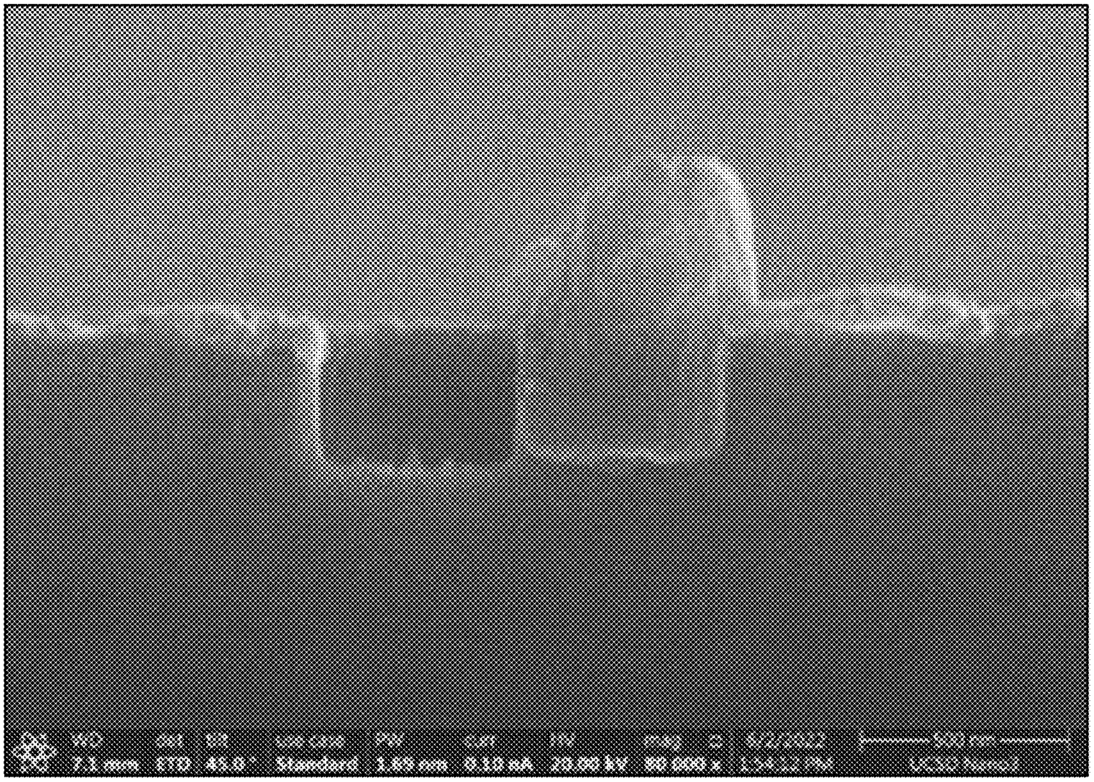
FIG. 9B is a SEM image of a cross-section of a developed photoresist in a concave region of a resin layer after backside exposure where ultraviolet light was directed at a 75° angle with respect to a surface plane of the resin layer.

For the example, ultraviolet light (55 mJ/$cm^2$) was directed through the ultraviolet light transparent resin layer (i.e., backside exposure) toward the shallow portion of the concave region at a 75° angle with respect to the surface plane of the resin layer at the shallow region. To achieve this angle, the ultraviolet light transparent resin layer was tilted 15° with respect to the UV light source. The resin layer overlying the deep portion of the concave region was not exposed to the ultraviolet light. A scanning electron micrograph of a cross-section of the developed photoresist in the concave region is shown in FIG. 9B. As depicted, no gap was formed between the photoresist and the sidewall of the concave region adjacent the shallow portion.

Additional Notes

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

While several examples have been described in detail, it is to be understood that the disclosed examples may be modified. Therefore, the foregoing description is to be considered non-limiting.

What is claimed is:

1. A method, comprising:

depositing a positive photoresist over a substrate including depressions separated by interstitial regions;

exposing the positive photoresist to ultraviolet light at an angle that is non-perpendicular, non-parallel, and offset from a surface plane of the depressions such that a first portion of the positive photoresist in each depression remains soluble and a second portion of the positive photoresist in each depression is rendered insoluble;

removing the soluble portions of the positive photoresist, thereby exposing a first substrate portion in each depression;

depositing a first functionalized layer over the first substrate portion in each depression;

removing the insoluble portions of the positive photoresist, thereby exposing a second substrate portion in each depression; and selectively applying a second functionalized layer over the second substrate portion in each depression.

2. The method as defined in claim 1, wherein the angle ranges from about 30° to about 55° or from about 125° to about 150° with respect to the surface plane of the depressions.

3. The method as defined in claim 1, wherein:

removing the soluble portions of the positive photoresist exposes the interstitial regions;

the first functionalized layer is also deposited over the interstitial regions; and the method further comprises polishing the first functionalized layer from the interstitial regions.

4. The method as defined in claim 1, further comprising forming the depressions in the substrate using imprinting or dry etching.

5. A method, comprising:

imprinting a resin layer of a multi-layer stack to form a patterned resin layer including a concave region having a deep portion and a shallow portion defined by a step portion, wherein the multi-layer stack includes the resin layer positioned over a sacrificial layer positioned over a transparent base support;

etching the patterned resin layer, thereby extending the deep portion into the transparent base support to create a depression portion, removing the step portion to expose a portion of the sacrificial layer, and forming interstitial regions of the patterned resin layer that surround the depression portion and the portion of the sacrificial layer;

depositing a negative photoresist over the interstitial regions, the depression portion, and the portion of the sacrificial layer;

exposing the negative photoresist to ultraviolet light i) through the transparent base support and ii) at an angle that is non-perpendicular, non-parallel, and offset from a surface plane of the interstitial regions such that an insoluble negative photoresist is generated in the depression portion and over at least a portion of the interstitial region that is adjacent to the deep portion, and a soluble negative photoresist is generated over the portion of the sacrificial layer;

utilizing the insoluble negative photoresist to create a second depression portion adjacent to the depression portion and to define a first functionalized layer over the second depression portion;

removing the insoluble negative photoresist, thereby exposing the depression portion; and selectively applying a second functionalized layer over the depression portion.

6. The method as defined in claim 5, wherein while the ultraviolet light is positioned at the angle, the method further comprises rotating the ultraviolet light to expose different portions of the negative photoresist in the deep portion to the ultraviolet light without exposing the negative photoresist that overlies the portion of the sacrificial layer to the ultraviolet light.

7. The method as defined in claim 5, wherein while the ultraviolet light is positioned at the angle, the method further comprises rotating the substrate to expose different portions of the negative photoresist in the deep portion to the ultraviolet light without exposing the negative photoresist that overlies the portion of the sacrificial layer to the ultraviolet light.

8. The method as defined in claim 5, wherein utilizing the insoluble negative photoresist involves:

dry etching i) portions of the patterned resin layer underlying the interstitial regions, ii) the sacrificial layer to expose the transparent base support, and iii) a portion of the transparent base support adjacent to the depression portion to form the second depression portion;

applying the first functionalized layer over the insoluble negative photoresist, the second depression portion, and the interstitial regions; and removing the insoluble negative photoresist and the first functionalized layer thereon to expose the depression portion.

9. The method as defined in claim 8, further comprising removing the first functionalized layer from the interstitial regions after the second functionalized layer is selectively applied.

10. The method as defined in claim 5, wherein utilizing the insoluble negative photoresist involves:

dry etching i) the portion of the sacrificial layer, and ii) a portion of the transparent base support adjacent to the depression portion and underlying the portion of the sacrificial layer to form the second depression portion;

applying the first functionalized layer over the insoluble negative photoresist, the second depression portion, and remaining portions of the sacrificial layer; and removing the insoluble negative photoresist and the first functionalized layer thereon to expose the depression portion.

11. The method as defined in claim 10, wherein after the second functionalized layer is selectively applied, the method further comprises lifting off the remaining portions of the sacrificial layer, including portions of the first functionalized layer thereon.

12. A method, comprising:

imprinting a resin layer of a multi-layer stack to form a patterned resin layer including a concave region having a deep portion and a shallow portion defined by a step portion, wherein the multi-layer stack includes the resin layer positioned over a sacrificial layer positioned over a transparent base support;

etching the patterned resin layer, thereby extending the deep portion into the transparent base support to create a depression portion, removing the step portion to expose a portion of the sacrificial layer, and forming interstitial regions of the patterned resin layer that surround the depression portion and the portion of the sacrificial layer;

depositing a negative photoresist over the interstitial regions, the depression portion, and the portion of the sacrificial layer;

exposing the negative photoresist to diffused ultraviolet light through the transparent base support such that an insoluble negative photoresist is generated in the depression portion and in contact with at least a portion of a sidewall that defines the deep portion, and a soluble negative photoresist is generated over the portion of the sacrificial layer;

utilizing the insoluble negative photoresist to create a second depression portion adjacent to the depression portion and to define a first functionalized layer over the second depression portion;

removing the insoluble negative photoresist, thereby exposing the depression portion; and selectively applying a second functionalized layer over the depression portion.

13. The method as defined in claim 12, wherein utilizing the insoluble negative photoresist involves:

dry etching i) portions of the patterned resin layer underlying the interstitial regions, ii) the sacrificial layer to expose the transparent base support, and iii) a portion of the transparent base support adjacent to the depression portion to form the second depression portion; and applying the first functionalized layer over the insoluble negative photoresist, the second depression portion, and the interstitial regions.

14. The method as defined in claim 13, further comprising removing the first functionalized layer from the interstitial regions after the second functionalized layer is selectively applied.

15. The method as defined in claim 12, wherein utilizing the insoluble negative photoresist involves:

dry etching i) the portion of the sacrificial layer, and ii) a portion of the transparent base support adjacent to the depression portion and underlying the portion of the sacrificial layer to form the second depression portion;

applying the first functionalized layer over the insoluble negative photoresist, the second depression portion, and remaining portions of the sacrificial layer; and removing the insoluble negative photoresist and the first functionalized layer thereon to expose the depression portion.

16. The method as defined in claim 15, wherein after the second functionalized layer is selectively applied, the method further comprises lifting off the remaining portions of the sacrificial layer, including portions of the first functionalized layer thereon.

17. The method as defined in claim 12, wherein prior to utilizing the insoluble negative photoresist to create the second depression portion, the method further comprises isotropically etching the insoluble negative photoresist to remove at least some of the insoluble negative photoresist from over the portion of the sacrificial layer.

18. A method, comprising:

applying a photoactive layer in depressions of a substrate including the depressions separated by interstitial regions;

exposing a first portion of the photoactive layer to ultraviolet light at a first angle that is non-perpendicular, non-parallel, and offset from a surface plane of the depressions such that the first portion of the photoactive layer in each depression becomes active and a second portion of the photoactive layer in each depression remains inactive;

selectively attaching a first functionalized layer to the first portion;

exposing the second portion of the photoactive layer to ultraviolet light at a second angle that is non-perpendicular, non-parallel, and offset from the surface plane of the depressions such that the second portion of the photoactive layer in each depression becomes active; and selectively attaching a second functionalized layer to the second portion.

19. The method as defined in claim 18, wherein the applying of the photoactive layer in the depressions involves:

depositing the photoactive layer over the depressions and the interstitial regions; and polishing the photoactive layer from the interstitial regions.

* * * * *